United States Patent
Matsumoto

(10) Patent No.: US 9,892,965 B2
(45) Date of Patent: Feb. 13, 2018

(54) CU WIRING MANUFACTURING METHOD AND CU WIRING MANUFACTURING SYSTEM

(71) Applicant: TOKYO ELECTRON LIMITED, Tokyo (JP)

(72) Inventor: Kenji Matsumoto, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/416,943

(22) Filed: Jan. 26, 2017

(65) Prior Publication Data
US 2017/0213763 A1    Jul. 27, 2017

(30) Foreign Application Priority Data
Jan. 27, 2016   (JP) ................. 2016-013283

(51) Int. Cl.
*H01L 21/4763*   (2006.01)
*H01L 21/768*   (2006.01)
(Continued)

(52) U.S. Cl.
CPC ...... *H01L 21/76886* (2013.01); *C23C 16/408* (2013.01); *C23C 16/45525* (2013.01); *C23C 16/56* (2013.01); *H01L 21/7684* (2013.01); *H01L 21/76802* (2013.01); *H01L 21/76846* (2013.01); *H01L 21/76864* (2013.01); *H01L 21/76871* (2013.01); *H01L 21/76879* (2013.01);
(Continued)

(58) Field of Classification Search
None
See application file for complete search history.

(56) References Cited

U.S. PATENT DOCUMENTS

2010/0112806 A1* 5/2010 Matsumoto ....... H01L 21/28556
                                                                         438/643
2011/0163451 A1   7/2011 Matsumoto et al.
(Continued)

FOREIGN PATENT DOCUMENTS

JP   2010-21447    1/2010
WO  2012/173067  12/2012

*Primary Examiner* — Bradley K Smith

(57) ABSTRACT

In a Cu wiring manufacturing method for manufacturing Cu wiring that fills a recess formed in a predetermined pattern on a surface of an interlayer insulating film of a substrate, a $MnO_x$ film that becomes a self-formed barrier film by reaction with the interlayer insulating film is formed at least on a surface of the recess by ALD. A $CuO_x$ film that becomes a liner film is formed on a surface of the $MnO_x$ film by CVD or ALD. An annealing process is performed on the substrate on which the $CuO_x$ film is formed and the $CuO_x$ film is reduced to a Cu film by oxidation-reduction reaction between the $MnO_x$ film and the $CuO_x$ film. A Cu-based film is formed on the Cu film obtained by reducing the $CuO_x$ film by PVD to fill the Cu-based film in the recess.

21 Claims, 20 Drawing Sheets

(51) Int. Cl.
*H01L 23/522* (2006.01)
*H01L 23/532* (2006.01)
*C23C 16/40* (2006.01)
*C23C 16/455* (2006.01)
*C23C 16/56* (2006.01)

(52) U.S. Cl.
CPC .... *H01L 21/76883* (2013.01); *H01L 23/5226* (2013.01); *H01L 23/53238* (2013.01)

(56) References Cited

U.S. PATENT DOCUMENTS

| | | | |
|---|---|---|---|
| 2013/0136859 A1* | 5/2013 | Matsumoto | C23C 16/40 427/243 |
| 2014/0103529 A1 | 4/2014 | Matsumoto et al. | |

* cited by examiner

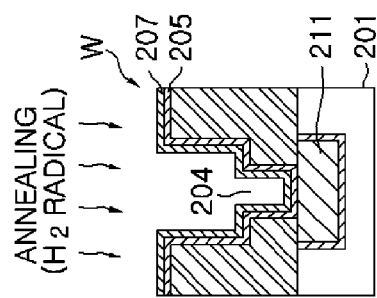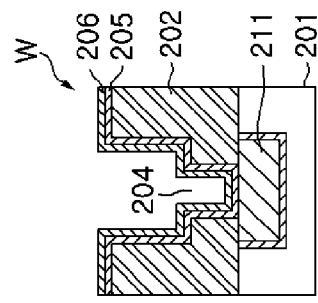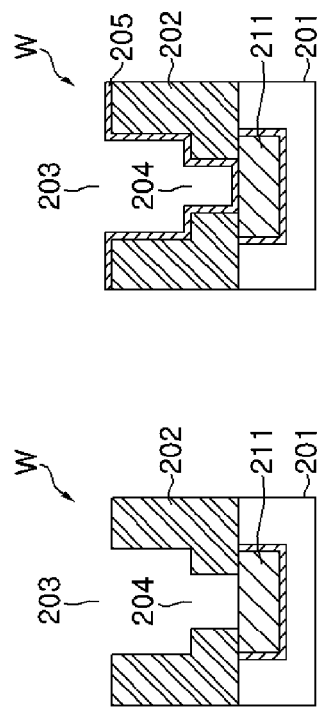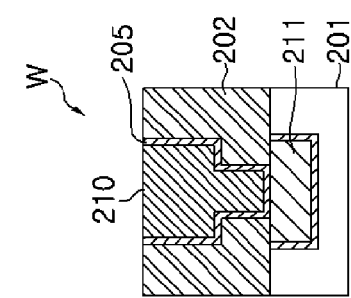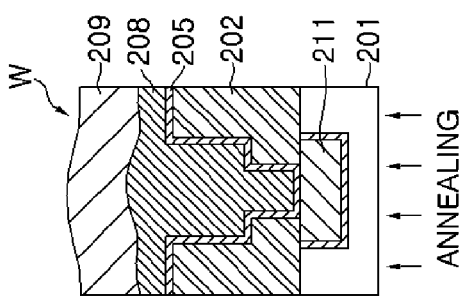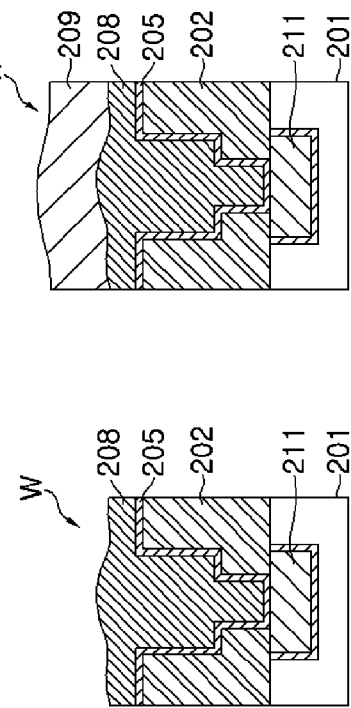

FIG. 3A
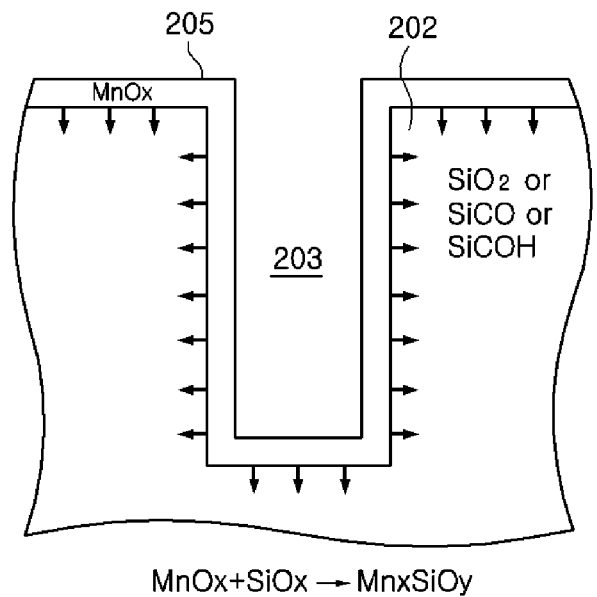
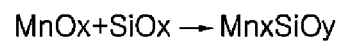
FIG. 3B
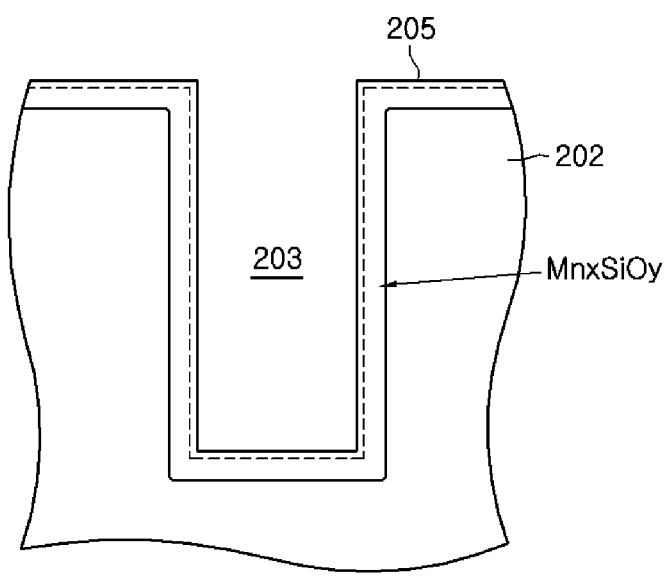

CuOx/MnOx
LAMINATED STRUCTURE

MnOx:ALD 130°C, 30cycle
CuOx: PVD AT ROOM
TEMPERATURE

ANNEALING OR
H₂ RADICAL PROCESS

ANNEALING : 300°C, 180sec
H₂ RADICAL PROCESS:
300°C, 30sec

Cu
LAMINATED STRUCTURE

Cu :iPVD 300°C

Ar ANNEALING SAMPLE

Ar ANNEALING SAMPLE

H₂ RADICAL PROCESS SAMPLE ing a low wiring resistance by suppressing an effect of a liner film on a wiring resistance in the case of using a $MnO_x$ film as a barrier film.

CU WIRING MANUFACTURING METHOD AND CU WIRING MANUFACTURING SYSTEM

CROSS-REFERENCE TO RELATED APPLICATIONS

This application claims priority to Japanese Patent Application No. 2016-013283 filed on Jan. 27, 2016, the entire contents of which is incorporated herein by reference.

FIELD OF THE INVENTION

The disclosure relates to a Cu wiring manufacturing method of manufacturing Cu wiring by filling Cu in a recess such as a trench or via hole formed on a substrate, and a Cu wiring manufacturing system.

BACKGROUND OF THE INVENTION

In a manufacturing of a semiconductor device, various processes such as film formation, etching and the like are repeatedly performed on a semiconductor wafer to manufacture a desired semiconductor device. Recently, in order to meet demands for high-speed semiconductor device, miniaturization of a wiring pattern and high level of integration, it is required to realize low resistance of wiring (high conductivity) and high electromigration resistance.

In view of the above, Copper (Cu), which has a higher electromigration resistance and a higher conductivity (lower resistance) than those of aluminum (Al) and tungsten (W), is being used as the wiring material.

The Cu wiring is formed by filling Cu in a trench or via formed in an interlayer insulating film. However, in order to prevent Cu from being diffused in the interlayer insulating film, a barrier film is formed before filling Cu.

As for a method of forming the barrier film, there is used a method of forming a tantalum (Ta) film, a titanium (Ti) film, a tantalum nitride (TaN) film, a titanium nitride (TiN) film or the like by physical vapor deposition (PVD). However, with a further miniaturization of a wiring pattern, it is difficult to obtain a sufficient step coverage by the above-mentioned method. Accordingly, there is examined a method of forming as the barrier film a manganese oxide ($MnO_x$) film by chemical vapor deposition (CVD) or atomic layer deposition (ALD) which can form a thin film with a good step coverage. Since, however, the $MnO_x$ film has low adhesion to Cu film, there has been proposed a Cu wiring forming method in which a Ruthenium (Ru) film having high adhesion to Cu film is formed as a liner film on the $MnO_x$ film and a Cu film is formed on the Ru film (see, e.g., Japanese Patent Application Publication No. 2010-21447).

Meanwhile, when the Ru film is formed on the $MnO_x$ film, it is difficult to obtain the Ru film having a good surface state due to a low nucleus formation density of Ru. Accordingly, there has been proposed a technique in which a hydrogen radical process (hereinafter, referred to as "$H_2$ radial process") is performed after the $MnO_x$ film is formed and then the Ru film is formed thereon (see, e.g., PCT Publication No. 2012/173067).

However, with a further miniaturization of a semiconductor device, a ratio of a cross sectional area of the barrier film and the liner film to a cross sectional area of Cu wiring is increased. As a result, a wiring resistance is increased.

SUMMARY OF THE INVENTION

In view of the above, the disclosure provides a Cu wiring manufacturing method capable of manufacturing Cu wiring having a low wiring resistance by suppressing an effect of a liner film on a wiring resistance in the case of using a $MnO_x$ film as a barrier film.

In accordance with a first aspect, there is provided a Cu wiring manufacturing method for manufacturing Cu wiring that fills a recess formed in a predetermined pattern on a surface of an interlayer insulating film of a substrate, the method including: forming a $MnO_x$ film that becomes a self-formed barrier film by reaction with the interlayer insulating film at least on a surface of the recess by ALD; forming a $CuO_x$ film that becomes a liner film on a surface of the $MnO_x$ film by CVD or ALD; performing an annealing process on the substrate on which the $CuO_x$ film is formed and reducing the $CuO_x$ film to a Cu film by oxidation-reduction reaction between the $MnO_x$ film and the $CuO_x$ film; and forming a Cu-based film on the Cu film obtained by reducing the $CuO_x$ film by PVD to fill the Cu-based film in the recess.

In accordance with a second aspect, there is provided a Cu wiring manufacturing system for manufacturing a Cu wiring that fills a recess formed in a predetermined pattern on a surface of an interlayer insulating film of a substrate, the system including: a $MnO_x$ film forming apparatus configured to form a $MnO_x$ film that becomes a self-formed barrier film by reaction with the interlayer insulating film at least on a surface of the recess by ALD; a $CuO_x$ film forming apparatus configured to form a $CuO_x$ film that becomes a liner film on a surface of the $MnO_x$ film by CVD or ALD; an annealing apparatus configured to perform an annealing process on the substrate on which the $CuO_x$ film is formed and reduce the $CuO_x$ film to a Cu film by oxidation-reduction reaction between the $MnO_x$ film and the $CuO_x$ film; and a Cu-based film forming apparatus configured to form a Cu-based film on the Cu film obtained by reducing the $CuO_x$ film by PVD and fill the Cu-based film in the recess.

In accordance with a third aspect, there is provided a computer-executable storage medium storing a program for controlling a Cu wiring manufacturing system, wherein the program, when executed on a computer, controls the Cu wiring manufacturing system to perform the Cu wiring manufacturing method described above.

BRIEF DESCRIPTION OF THE DRAWINGS

The objects and features of the disclosure will become apparent from the following description of embodiments, given in conjunction with the accompanying drawings, in which:

FIGS. 2A to 2H are process cross sectional views for explaining the Cu wiring manufacturing method according to the embodiment;

FIGS. 3A and 3B are diagrams for explaining a mechanism in which a $MnO_x$ film is formed in a trench and a self-formed barrier film is formed by reaction with a base interlayer insulating film;

DETAILED DESCRIPTION OF THE EMBODIMENTS

Hereinafter, embodiments will be described in detail with respect to the accompanying drawings.

Embodiment of Cu Wiring Manufacturing Method

Figure 1:
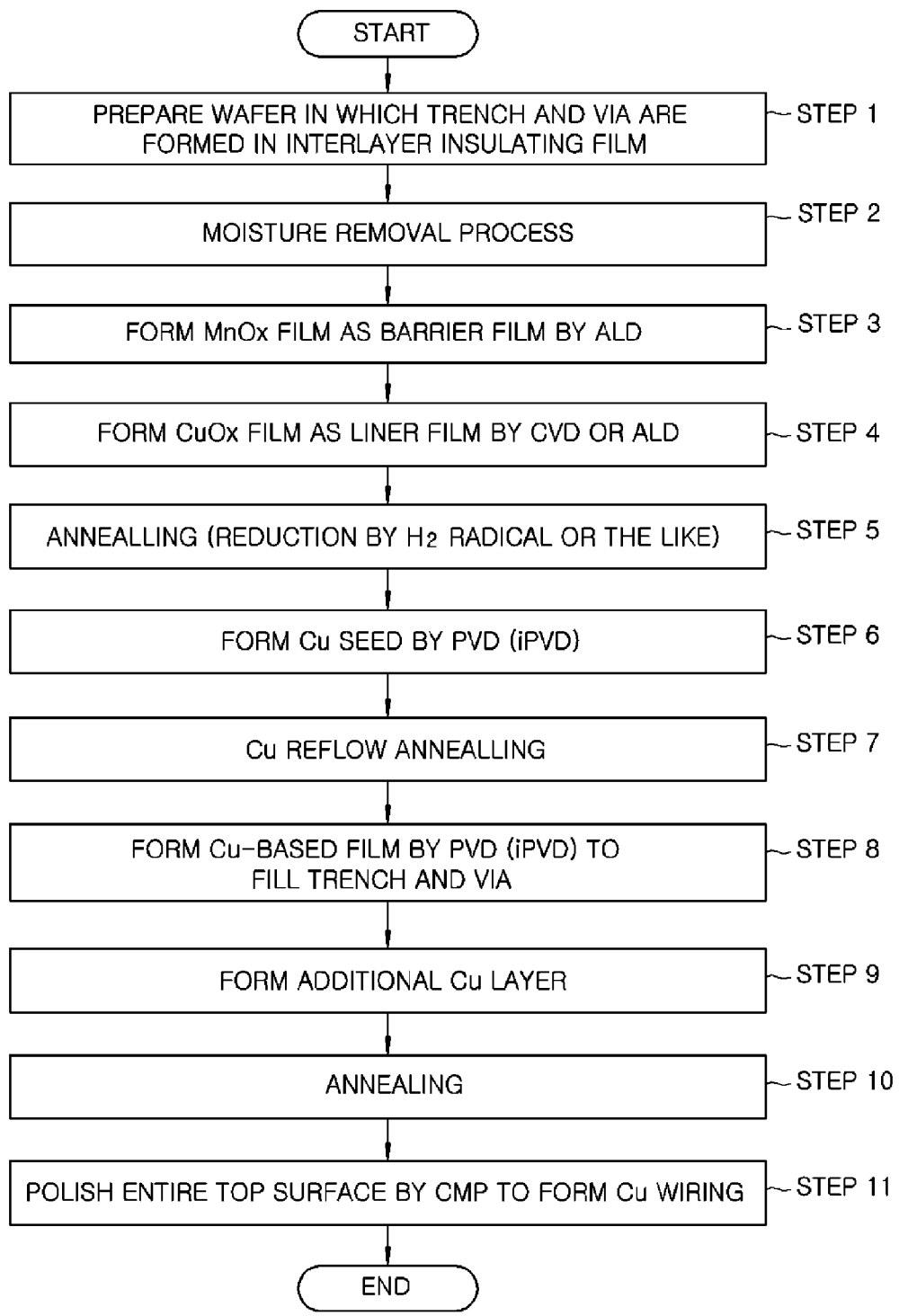
FIG. 1 is a flowchart of a Cu wiring manufacturing method according to an embodiment.

An embodiment of a Cu wiring manufacturing method will be described with reference to a flowchart of FIG. 1 and process cross sectional views of FIGS. 2A to 2H.

In the following, manganese oxide may include MnO, Mn$_3$O$_4$, Mn$_2$O$_3$, MnO$_2$ and the like and, thus, they are collectively referred to as MnO$_x$. Copper oxide may include Cu$_2$O, CuO and the like and, thus, they are collectively referred to as CuO$_x$.

First, there is prepared a semiconductor wafer (hereinafter, simply referred to as "wafer") W in which an interlayer insulating film 202 made of a SiO$_2$ film, a low-k film (SiCO, SiCOH or the like) or the like is formed on a lower structure 201 (details thereof are omitted) including a lower Cu wiring 211, and a trench 203 and a via hole (hereinafter, simply referred to as "via") 204 are formed in a predetermined pattern in the interlayer insulating film 202 (step 1, FIG. 2A).

Next, with respect to the wafer W, a degassing process or a pre-cleaning process is performed as pretreatment to remove moisture of a surface of the insulating film and copper-oxide formed on a surface of the lower Cu wiring 211 (step 2, not shown in FIGS. 2A to 2H). Thereafter, a MnO film 205 serving as a barrier film for suppressing diffusion of Cu is formed on an entire surface including surfaces of the trench 203 and the via 204 by ALD (step 3, FIG. 2B). Next, a CuO$_x$ film 206 is formed as a liner film by CVD or ALD on a surface of the MnO$_x$ film 205 (step 4, FIG. 2C).

Then, an annealing process is performed on the wafer W on which the CuO$_x$ film 206 is formed (step 5, FIG. 2D). Accordingly, oxidation-reduction reaction between MnO$_x$ of the barrier film and CuO$_x$ of the liner film occurs. In this process, the CuO$_x$ film 206 is reduced and becomes a Cu film 207. The process of reducing CuO$_x$ may be performed by H$_2$ radicals or the like during the annealing process.

Next, a Cu seed made of Cu or a Cu alloy is formed by PVD and preferably by iPVD (Ionized Physical Vapor Deposition) (step 6, not shown in FIG. 2). Then, Cu reflow annealing (process of filling Cu in a fine recess such as a via hole or the like by reflowing the Cu seed by annealing) is performed (step 7, not shown in FIG. 2). Thereafter, a Cu-based film 208 made of Cu or a Cu alloy is formed by PVD and preferably by iPVD to fill (dry fill) the trench 203 and the via 204 (step 8, FIG. 2E). The processes from the Cu seed formation to the Cu-based film formation may be performed by dry filling of high-temperature sputtering.

Then, if necessary, in preparation for a subsequent planarization process, Cu plating is performed on an entire surface of the wafer W to form an additional Cu layer 209 on the Cu-based film 208 (step 9, FIG. 2F). The additional Cu layer 209 may be formed by the PVD. After the additional Cu layer 209 is formed, an annealing process is performed (step 10, FIG. 2G).

Thereafter, the entire surface of the wafer W is polished by CMP (chemical mechanical polishing), so that the additional Cu layer 209 of a field portion other than the trench 203, the Cu-based film 208, and the MnO$_x$ film 205 serving as a barrier film are removed and the entire surface of the wafer W is planarized (step 11, FIG. 2H). As a consequence, a Cu wiring 210 is formed in the trench and the via.

After the Cu wiring 210 is formed, a barrier film made of SiN or SiCN having an etching stop function is formed on the entire surface of the wafer W including the Cu wiring 210 and the interlayer insulating film 202. Further, a metal cap film such as CoW(P) or the like may be selectively formed on the Cu wiring 210 of the surface of the wafer W.

Next, main processes among the above series of processes will be described in detail.

(MnO$_x$ Film Formation)

First, a process of forming the MnO$_x$ film 205 serving as a barrier film will be described.

The MnO$_x$ film 205 is formed by ALD (atomic layer deposition) as described above. Specifically, the MnO$_x$ film 205 is formed by alternately supplying a Mn compound-containing gas and an oxygen-containing gas into a processing chamber with a purge process for purging an inside of the processing chamber interposed between the supply of the Mn compound-containing gas and the supply of the oxygen-containing gas.

The $MnO_x$ film 205 reacts with Si and O components in the interlayer insulating film 202 at least at a boundary with the interlayer insulating film 202 by heat generated during film formation or heat generated during a subsequent process (annealing process or the like). Accordingly, manganese silicate ($Mn_xSiO_y$, ($MnSiO_3$ or $Mn_2SiO_4$)) is formed and becomes a self-formed barrier film.

In other words, the $MnO_x$ film 205 reacts with Si and O included in the interlayer insulating film 202 that is a base film as shown in FIG. 3A and, thus, a barrier film can be formed at the interlayer insulating film 202 that is a base film as shown in FIG. 3B. Therefore, a volume of the barrier film in a recess such as the trench or the via can be minimized to be close to 0. Accordingly, a low resistance of the wiring can be realized by increasing a volume of Cu in the wiring. In view of increasing the volume of Cu in the wiring, it is preferable that the $MnO_x$ film 205 has a thin thickness ranging from 1 nm to 5 nm.

As for the Mn compound, it is preferable to use a cyclopentadienyl-based manganese compound, an amidinate-based manganese compound and an amide amino alkane-based manganese compound.

As for the cyclopentadienyl-based manganese compound, there may be used bis(alkylcyclopentadienyl) manganese expressed by a general formula $Mn(RC_5H_4)_2$ such as $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$ and $(t-BuCp)_2Mn[=Mn(C_4H_9C_5H_4)_2]$.

As for the amidinate-based manganese compound, there may be used bis(N, N'-dialkylacetamidinate) manganese expressed by a general formula $Mn(R^1N—CR^3—NR^2)_2$ which is disclosed in U.S. Patent Application Publication No. 2009/0263965 A1.

As for the amide amino alkane-based manganese compound, there may be used bis(N, N'-1-alkylamid-2-dialkylaminoalkane) manganese expressed by a general formula $Mn(R^1N—Z—NR^2_2)_2$ which is disclosed in PCT Publication No. 2012/060428. Here, "R, $R^1$, $R^2$, $R^3$" in the above general formula represents a functional group indicated by $—C_nH_{2n+1}$ (n being an integer of 0 or more), and "Z" represents a functional group indicated by $—C_nH_{2n}—$ (n being an integer of 1 or more).

As for other manganese compounds, it is possible to use a carbonyl-based manganese compound or a beta-diketone-based manganese compound. As for the carbonyl-based manganese compound, there may be used dimanganese decacarbonyl ($Mn_2(CO)_{10}$) or methylcyclopentadienyltricarbonylmanganese (($CH_3C_5H_4)Mn(CO)_3$). Especially, in the case of using $Mn_2(CO)_{10}$ having a simple structure, the formation of a Mn film having less impurities is expected.

As for the oxygen-containing gas, it is possible to use $H_2O$ (water vapor), $N_2O$, $NO_2$, NO, $O_3$, $O_2$, $H_2O_2$, CO, $CO_2$ and alcohols such as methyl alcohol, ethyl alcohol or the like.

In the case of forming the $MnO_x$ film 205 by ALD, if a film forming temperature is higher than a thermal decomposition start temperature of a manganese compound as a film forming material, a film forming mode is switched from an ALD mode to a CVD mode, which results in a rough surface. Therefore, it is preferable to set the ALD film forming temperature to be lower than a thermal decomposition temperature of the manganese compound used. Since it is not possible to form the $MnO_x$ film using an organic Mn compound by ALD at a temperature lower than a vaporization start temperature (it is not possible to supply the organic Mn compound as a gas into the processing chamber), the vaporization start temperature becomes a practical lower limit. From the above, it is preferable to set the film forming temperature (wafer temperature) at the time of using the above manganese compound to about 100° C. to 230° C.

($CuO_x$ Film Formation)

Next, a process of forming the $CuO_x$ film 206 serving as a liner film will be described.

The $CuO_x$ film 206 is formed by CVD or ALD as described above. Specifically, a Cu compound-containing gas and an oxygen-containing gas are used. In the case of CVD, the film formation is performed by simultaneously supplying the Cu compound-containing gas and the oxygen-containing gas into the processing chamber. In the case of ALD, the film formation is performed by alternately supplying the Cu compound-containing gas and the oxygen-containing gas into the processing chamber with a process of purging the inside of the processing chamber between the supply of the Cu compound-containing gas and the supply of the oxygen-containing gas. By forming the $CuO_x$ film by CVD or ALD, the liner film can be formed with a good step coverage. When Cu in a metal state is deposited, agglomeration becomes a problem. However, a smooth surface can be obtained because the deposit is an oxide.

As for the Cu compound used for film formation, it is preferable to use Cu(hfac)TMVS, Cu(hfac)$_2$, Cu(hfac)ATMS, Cu(hfac)DMDVS, Cu(hfac)TMOVS, Cu(dibm)$_2$, or Cu amidinate.

As for the oxygen-containing gas used for oxidation, it is possible to use $H_2O$ (water vapor), $N_2O$, $NO_2$, NO, $O_3$, $O_2$, $H_2O_2$, CO, $CO_2$ or alcohols such as methyl alcohol, ethyl alcohol or the like.

The film forming temperature (wafer temperature) at this time is preferably within a range from 75° C. to 450° C. The pressure in the processing chamber during the film formation is preferably within a range from 1 Pa to 13000 Pa.

The thickness of the $CuO_x$ film is preferably within a range from 1 nm to 15 nm.

The $MnO_x$ film and the $CuO_x$ film may be formed by separate devices. However, the $MnO_x$ film formation using ALD and the $CuO_x$ film formation using CVD or ALD may also be performed in-situ by providing a Mn compound-containing gas supply system, a Cu compound-containing gas supply system and an oxygen-containing gas supply system in a single processing chamber. Accordingly, the formation of the $MnO_x$ film and the formation of the $CuO_x$ film can be consecutively performed with a high throughput. In that case, an ALD-$MnO_x$ film and an ALD-$CuO_x$ film may be simply laminated. However, in order to further improve the adhesivity therebetween, an ALD-$CuMnO_x$ film may be formed as a mixing layer between the ALD-$MnO_x$ film and the ALD-$CuO_x$ film. In that case, the processing is repeated in the order of the supply of the manganese compound-containing gas, the purge of the inside of the processing chamber, the supply of the oxygen-containing gas, the purge of the inside of the processing chamber, the supply of Cu compound-containing gas, the purge of the inside of the processing chamber, the supply of the oxygen-containing gas, and the purge of the inside of the processing chamber.

(Annealing Process)

By performing an annealing process after the formation of the $CuO_x$ film, oxidation-reduction reaction between the $MnO_x$ film and the $CuO_x$ film occurs. Thus, the adhesivity between the $MnO_x$ film and the $CuO_x$ film is improved, and it is not necessary to reduce the $MnO_x$ film by $H_2$ radicals or the like unlike the conventional case of using a Ru film as a liner film. During the oxidation-reduction reaction, $CuO_x$ is reduced to Cu and becomes a part of the wiring. Therefore, the increase in the wiring resistance which occurs when the Ru film as the liner film remains can be suppressed. Although it is preferable to completely reduce $CuO_x$ to Cu, it is not necessary to completely reduce $CuO_x$. Even when the $CuO_x$ film as a liner film is deposited on the bottom of the via hole, it is reduced to Cu by the annealing. Accordingly, the increase in the via resistance can be prevented.

The $MnO_x$ film as a barrier film reacts with a Si-containing insulator (SiOCH, SiOH, $SiO_2$ or the like) of a base by the annealing, thereby forming Mn silicate as described above.

Hereinafter, the oxidation-reduction reaction between the $MnO_x$ film and the $CuO_x$ film and the thermodynamic calculation result of the reaction will be described. A numerical value of the right side indicates a change in Gibbs free energy per 1 mol of Mn at 300K.

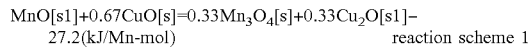

MnO[s1]+0.67CuO[s]=0.33Mn$_3$O$_4$[s]+0.33Cu$_2$O[s1]−
27.2(kJ/Mn-mol)     reaction scheme 1

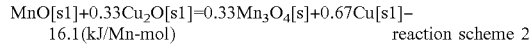

MnO[s1]+0.33Cu$_2$O[s1]=0.33Mn$_3$O$_4$[s]+0.67Cu[s1]−
16.1(kJ/Mn-mol)     reaction scheme 2

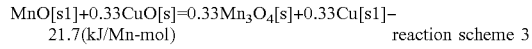

MnO[s1]+0.33CuO[s]=0.33Mn$_3$O$_4$[s]+0.33Cu[s1]−
21.7(kJ/Mn-mol)     reaction scheme 3

In all of the reaction schemes 1 to 3, the change in Gibbs free energy is a minus value. This indicates the oxidation-reduction reaction can occur and CuO can be reduced to Cu by the corresponding reaction.

The annealing process can be performed under an inert gas atmosphere, e.g., Ar gas or the like, at a processing temperature (wafer temperature) of 100° C. to 400° C.

During the annealing process, a $CuO_x$ reduction technique such as $H_2$ radicals or the like may also be used. Accordingly, the reduction of the $CuO_x$ film is promoted. Even when the $CuO_x$ film is thick, it is possible to reliably reduce the $CuO_x$ film.

As for the reduction technique, it is possible to use $H_2$ annealing, $H_2$ plasma, or organic acid atmosphere annealing, other than $H_2$ radicals.

In the case of using $H_2$ radicals as the reduction technique, a $H_2$ radical generation method is not particularly limited. For example, remote plasma processing, plasma processing, or processing in which hydrogen gas is made to be in contact with a heating filament may be used. The remote plasma processing is performed by generating a $H_2$ plasma outside the processing chamber by using an inductively coupled plasma, a microwave plasma or the like, supplying the $H_2$ plasma thus generated into the processing chamber, and performing processing by using $H_2$ radicals in the plasma. The plasma processing is performed by generating a $H_2$ plasma in the processing chamber by a proper device and performing processing by using $H_2$ radicals in the plasma. In the processing in which hydrogen gas is made to be in contact with a heating filament, the heating filament functions as a catalyst and $H_2$ radicals are generated by catalytic cracking reaction.

In the case of using a $H_2$ plasma for the reduction, a $H_2$ plasma generation method is not particularly limited. The plasma processing may be performed by using a $H_2$ plasma generated by a proper device.

In the $H_2$ annealing, $H_2$ gas is used as an annealing gas. In the organic acid gas atmosphere annealing, an organic acid, e.g., formic acid (HCOOH) or the like, is used as an annealing gas.

In the case of using the $CuO_x$ reduction technique during the annealing process, the processing temperature (wafer temperature) is preferably within a range from 100° C. to 400° C.

By directly reducing the surface of the $CuO_x$ film by $H_2$ radicals or the like, the following effects can be expected.

(1) A reduced film surfaces becomes metal Cu, so that good wettability with a Cu seed to be formed later by PVD can be ensured.

(2) A reduced film surface becomes metal Cu, so that a Cu dry filling process using PVD can be performed as on the conventional Ru film.

(3) The boundary between the original CuOx and the reduced Cu is not clear, so that the adhesivity of the Cu film is improved.

(Cu-Based Film Formation)

Next, a process of forming the Cu-based film 208 will be described.

As described above, the Cu-based film 208 is formed by PVD that is a dry process. At this time, iPVD in which a film is formed while attracting ions to a wafer is preferably used.

In a general PVD film forming process, when the Cu-based film 208 is filled in a trench or a via, overhang that blocks the opening of the trench or the via may be easily generated by agglomeration of Cu. However, the generation of the overhang can be suppressed by moving Cu or a Cu alloy on the Cu film 207 generated by reduction of the $CuO_x$ film 206. To do so, iPVD is used, and film forming action of Cu ions and etching action of ions (Ar ions) of a plasma generating gas are controlled by adjusting a bias power applied to a wafer. Accordingly, satisfactory fillability can be obtained even in a trench or via having a small opening. At this time, in view of ensuring good fillability by allowing mobility of Cu, it is preferable to perform a high temperature process (65° C. to 400° C.) that allows Cu to migrate. In this case, the temperature is preferably within a range from 230° C. to 350° C. and more preferably about 300° C. By performing the PVD film formation at a high temperature, Cu crystal grain can grow and a resistance of a Cu wiring can be reduced by reducing grain boundary scattering. Further, as described above, the $CuO_x$ 206 serving as a base film for the Cu-based film 208 can be formed thin and uniformly by CVD or ALD. Since the $CuO_x$ film 206 becomes a Cu film 207 by oxidation-reduction reaction between $CuO_x$ and $MnO_x$ by performing annealing, Cu or Cu alloy is not agglomerated but moves on the Cu film 207. Accordingly, the generation of overhang in a fine recess can be suppressed. As a result, the Cu-based film 208 (Cu or Cu alloy) can be reliably filled without generating a void.

A pressure (process pressure) in the processing chamber at the time of forming the Cu-based film is preferably set to 0.133 to 13.3 Pa, and more preferably, to 4.66 to 12.0 Pa.

A Cu alloy used as the Cu-based film 208 representatively includes Cu—Al and Cu—Mn. As for another Cu alloy, there may be used Cu—Mg, Cu—Ag, Cu—Sn, Cu—Pb, Cu—Zn, Cu—Pt, Cu—Au, Cu—Ni, Cu—Co, Cu—Ti or the like.

A Cu seed formed on an inner wall of the recess before the formation of the Cu-based film 208 is preferably formed by using Cu or Cu alloy by iPVD as in the case of the formation of the Cu-based film 208.

As described above, in the present embodiment, the MnO film 205 that can be formed thin as a self-formed barrier is formed by ALD, and the $CuO_x$ film 206 is formed as a liner film thereon by CVD or ALD. Therefore, the $CuO_x$ film 206 can be formed with a high step coverage. Further, by performing the annealing later, the oxidation-reduction reaction between $MnO_x$ and $CuO_x$ occurs and the adhesivity between the $MnO_x$ film 205 and the $CuO_x$ film 206 is improved.

At the same time, the $CuO_x$ film is reduced to the Cu film 207 and becomes a part of the wiring. Accordingly, the liner film is eliminated and the volume of the Cu wiring is increased by the eliminated amount of the liner film. As a result, the Cu wiring having a low resistance can be realized.

By using the $MnO_x$ film 205 as a barrier film, the $MnO_x$ film can be formed thin as a self-formed barrier. Thus, it is possible to maximize a volume of the Cu wiring in a recess such as a trench, a via or the like. Accordingly, the resistance of the Cu wiring can be further reduced. Further, since Cu is filled by iPVD at a high temperature, a Cu grain can be increased and the grain boundary scattering can be reduced. As a consequence, the resistance of the Cu wiring can be further reduced.

After the $CuO_x$ film 206 is formed as a liner film in the step 4, the annealing of the step 5 can be omitted and the function of annealing can be obtained from the Cu reflow annealing of the step 7 or from the heat treatment for the filling of the Cu-based film 208. The fillability of the Cu-based film 208 varies depending on a pattern shape or the like. Therefore, the Cu seed formation of the step 6 and the Cu reflow annealing of the step 7 may be omitted depending on the pattern shape.

TEST EXAMPLES

Hereinafter, test examples of the present disclosure will be described.

Test Example 1

First, it is checked whether or not $CuO_x$ of a $CuO_x/MnO_x$ laminated structure is reduced to Cu by the Ar annealing or the $H_2$ radical process.

Figure 4A:
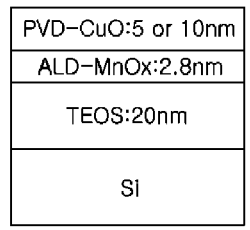
FIGS. 4A to 4C are views for explaining a manufacturing method of a sample used in a test example 1.
Figure 4B:
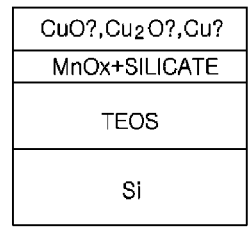
Figure 4C:
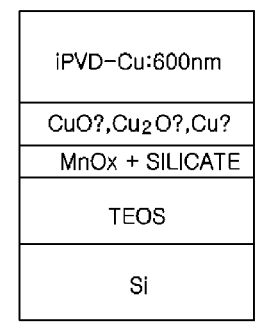

As shown in FIGS. 4A to 4C, a $CuO_x/MnO_x$ laminated structure was manufactured by forming on a Si substrate a $SiO_2$ film with a thickness of 20 nm by CVD using TEOS, forming a $MnO_x$ film thereon with a thickness of 2.8 nm by ALD of 30 cycles at 130° C. while using an amidoaminoalkane-based manganese compound as an organic Mn compound and $H_2O$ (water vapor) as an oxygen-containing gas, and then forming a CuO film thereon with a thickness of 5 nm or 10 nm by PVD at a room temperature, for convenience (see FIG. 4A). Next, the annealing process using Ar gas was performed at 300° C. for 180 sec, or the $H_2$ radical process was performed at 300° C. for 30 sec (see FIG. 4B). Thereafter, a Cu film was formed with a thinness of 600 nm by iPVD at 300° C. (see FIG. 4C). In this manner, a sample was manufactured.

Then, the Si substrate was removed from the sample and X-ray photoelectron spectroscopy (XPS) in a depth direction from the $SiO_2$ film to the Cu film was analyzed by Ar sputtering. A $SiO_2$ equivalent sputtering yield at that time was about 2 nm/min.

Figure 5:
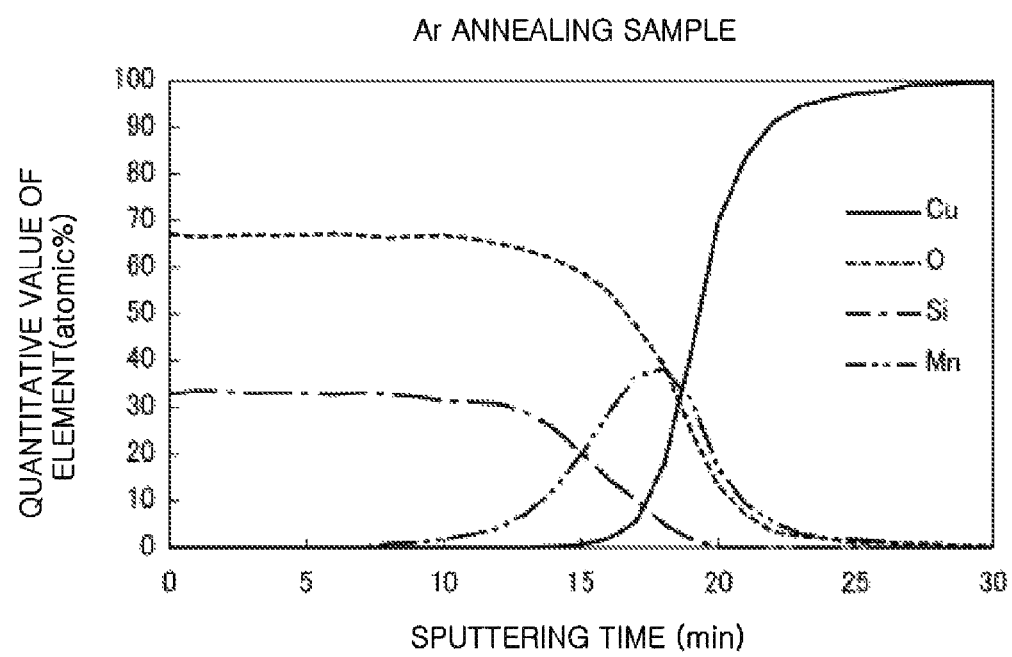
FIG. 5 shows quantitative values of elements with respect to sputtering time (distance in a depth direction) of a sample in which Ar annealing of the test example 1 is performed.
Figure 6:
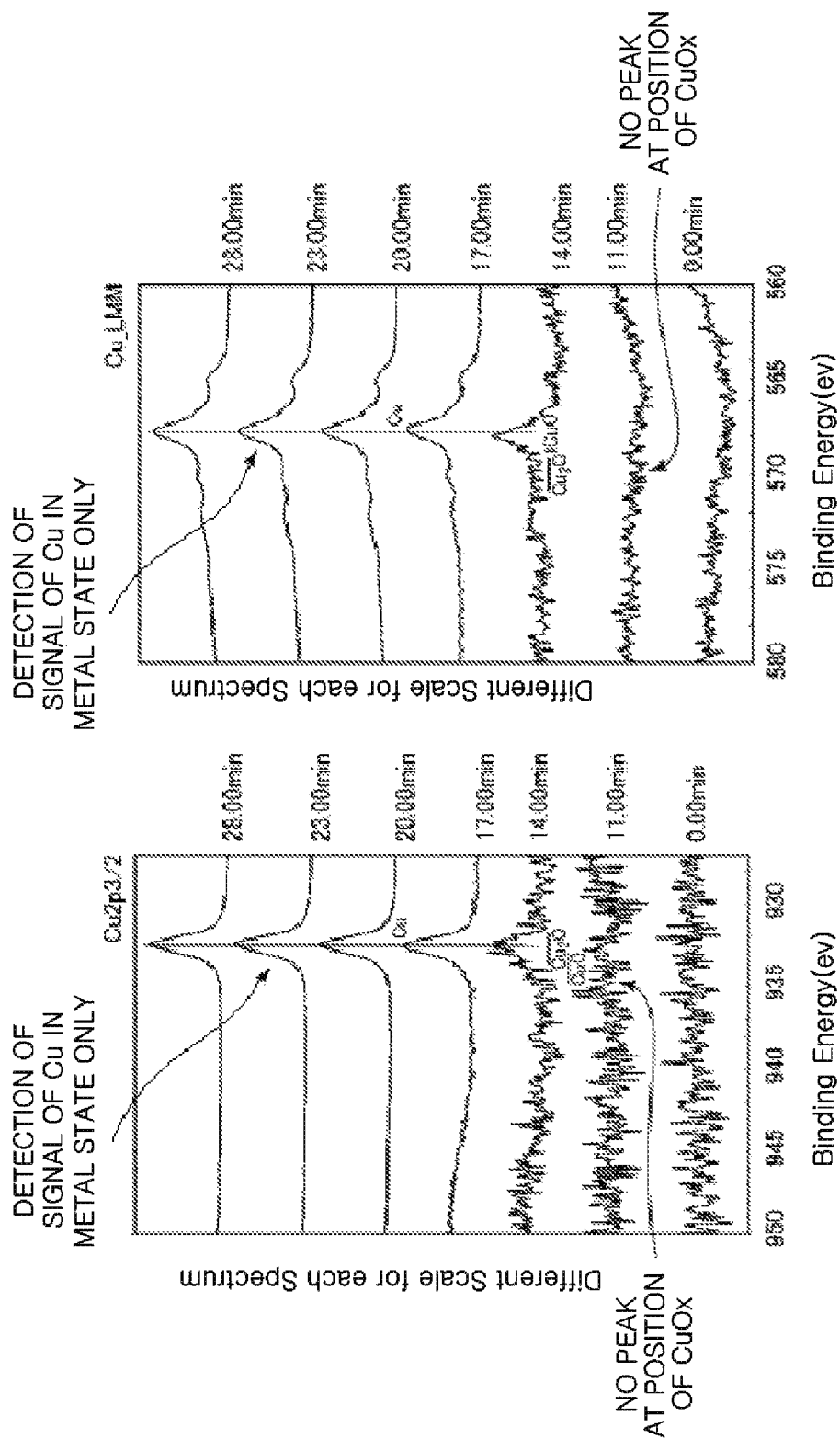
FIG. 6 shows XPS spectra of Cu2p3/2 and Cu LMM in a Cu/$CuO_x$/$MnO_x$/$SiO_2$ laminated structure of a sample in which the Ar annealing process of the test example 1 is performed.
Figure 7:
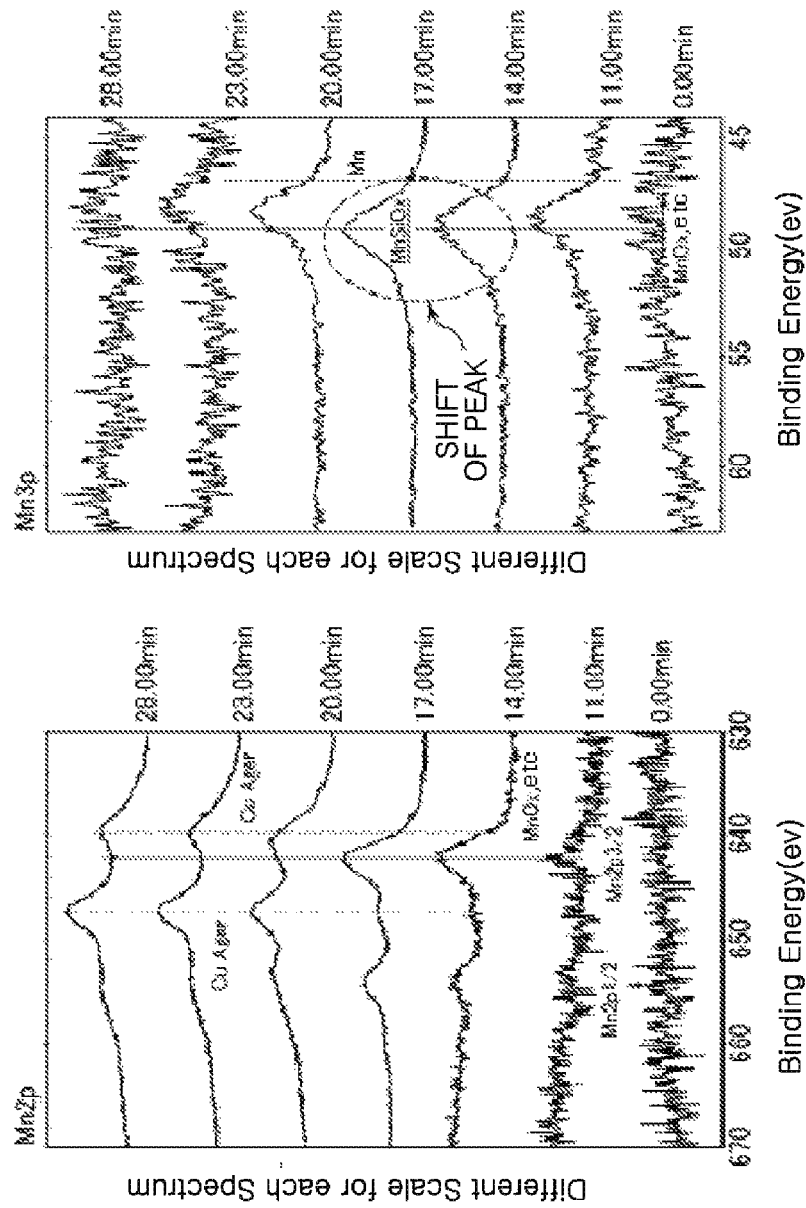
FIG. 7 shows XPS spectra of Mn2p and Mn3p in the Cu/CuO$_x$/MnO$_x$/SiO$_2$ laminated structure of the sample in which the Ar annealing process of the test example 1 is performed.
Figure 8:
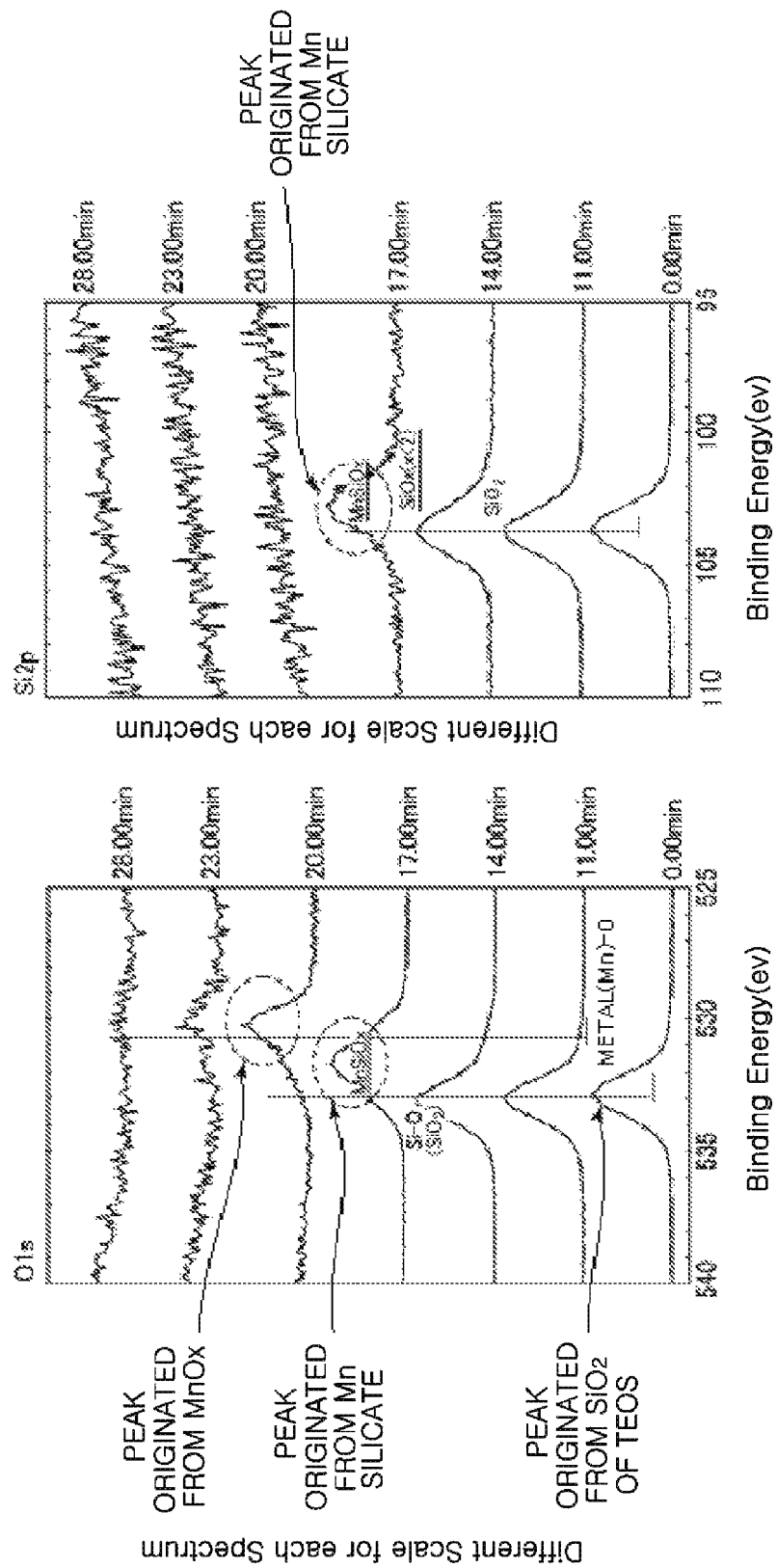
FIG. 8 shows XPS spectra of O1s and Si2p in the Cu/CuO$_x$/MnO$_x$/SiO$_2$ laminated structure of the sample in which the Ar annealing process of the test example 1 is performed.

The result of the sample in which the Ar annealing is performed is shown in FIGS. 5 to 8. FIG. 5 shows quantitative values of elements with respect to sputtering time (distance in a depth direction) of a sample in which Ar annealing of the test example 1 is performed. FIG. 6 shows XPS spectra of Cu2p3/2 and Cu LMM in a $Cu/CuO_x/MnO_x/SiO_2$ laminated structure of a sample in which the annealing process of the test example 1 is performed. FIG. 7 shows XPS spectra of Mn2p and Mn3p in the $Cu/CuO_x/MnO_x/SiO_2$ laminated structure of the sample in which the annealing process of the test example 1 is performed. FIG. 8 shows XPS spectra of O1s and Si2p in the $Cu/CuO_x/MnO_x/SiO_2$ laminated structure of the sample in which the annealing process of the test example 1 is performed.

In the sample in which the Ar annealing is performed, as shown in FIG. 6, a peak is not shown at the position of $CuO_x$ in the $CuO_x$ film formed on the $MnO_x$ film and only a signal of Cu in a metal state is detected. Therefore, it has been confirmed that $CuO_x$ is reduced to Cu. As shown in FIGS. 7 and 8, on a $MnO_x/SiO_2$ interface, a Mn3p peak is shifted to a high binding energy and a Si2p peak is shifted to a low binding energy. Therefore, there is a high possibility that Mn silicate is formed. In addition, a peak originated from $MnO_x$ is shown, whereas a peak of metal Mn is not shown, which indicates that $MnO_x$ exists but metal Mn does not exist.

Next, the result of the sample in which the $H_2$ radical process is performed is shown in FIGS. 9 to 12.

Figure 9:
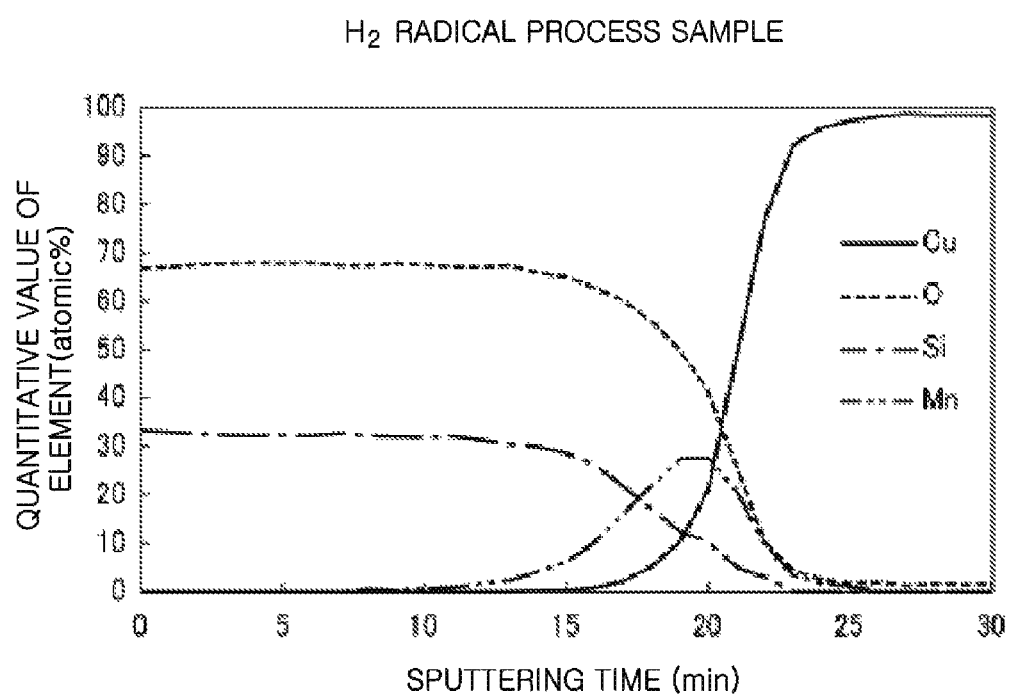
FIG. 9 shows quantitative values of elements with respect to sputtering time (distance in a depth direction) of a sample in which a H$_2$ radical process of the test example 1 is performed.
Figure 10:
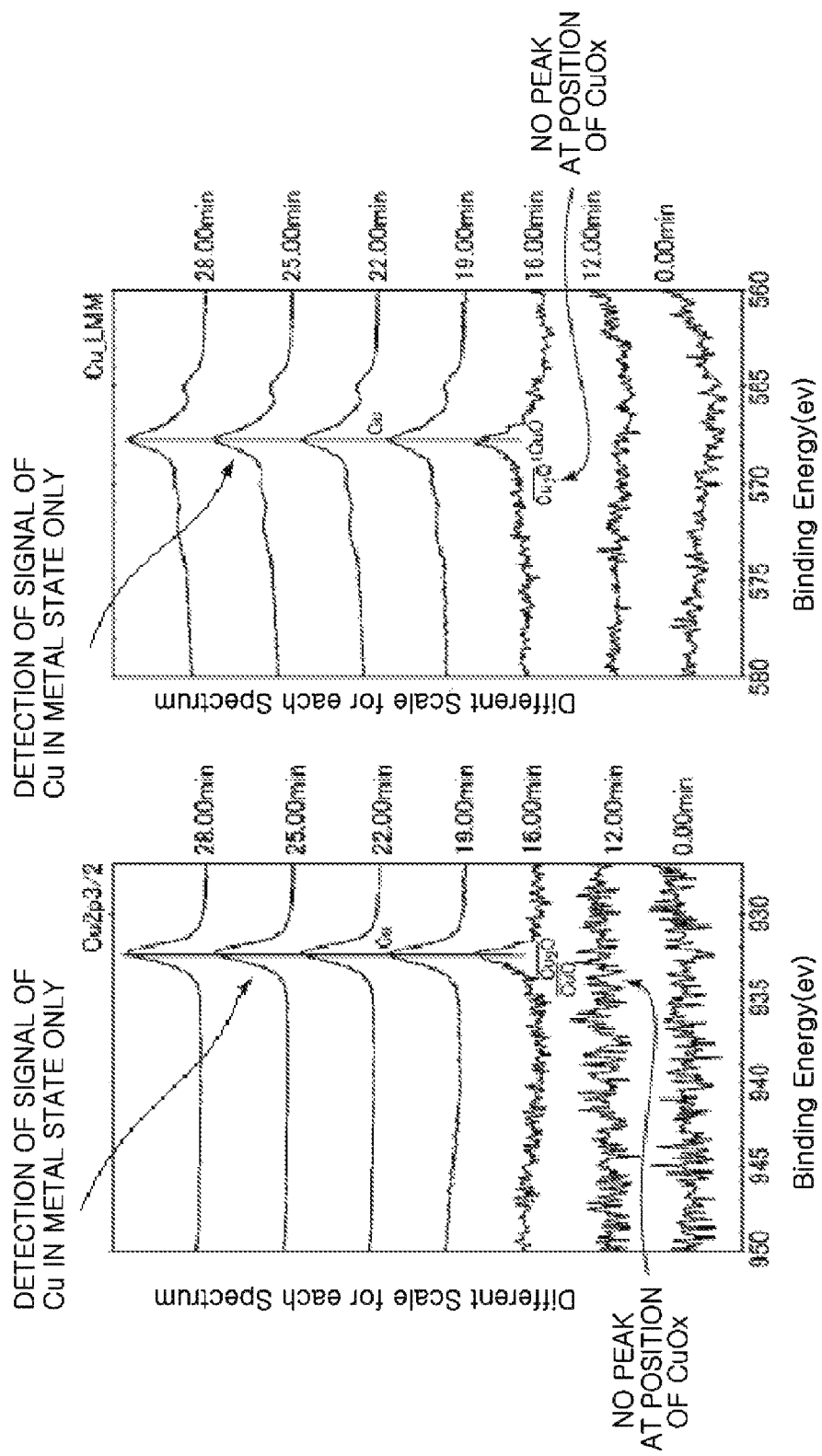
FIG. 10 shows XPS spectra of Cu2p3/2 and Cu LMM in a Cu/CuO$_x$/MnO$_x$/SiO$_2$ laminated structure of a sample in which the H$_2$ radical process of the test example 1 is performed.
Figure 11:
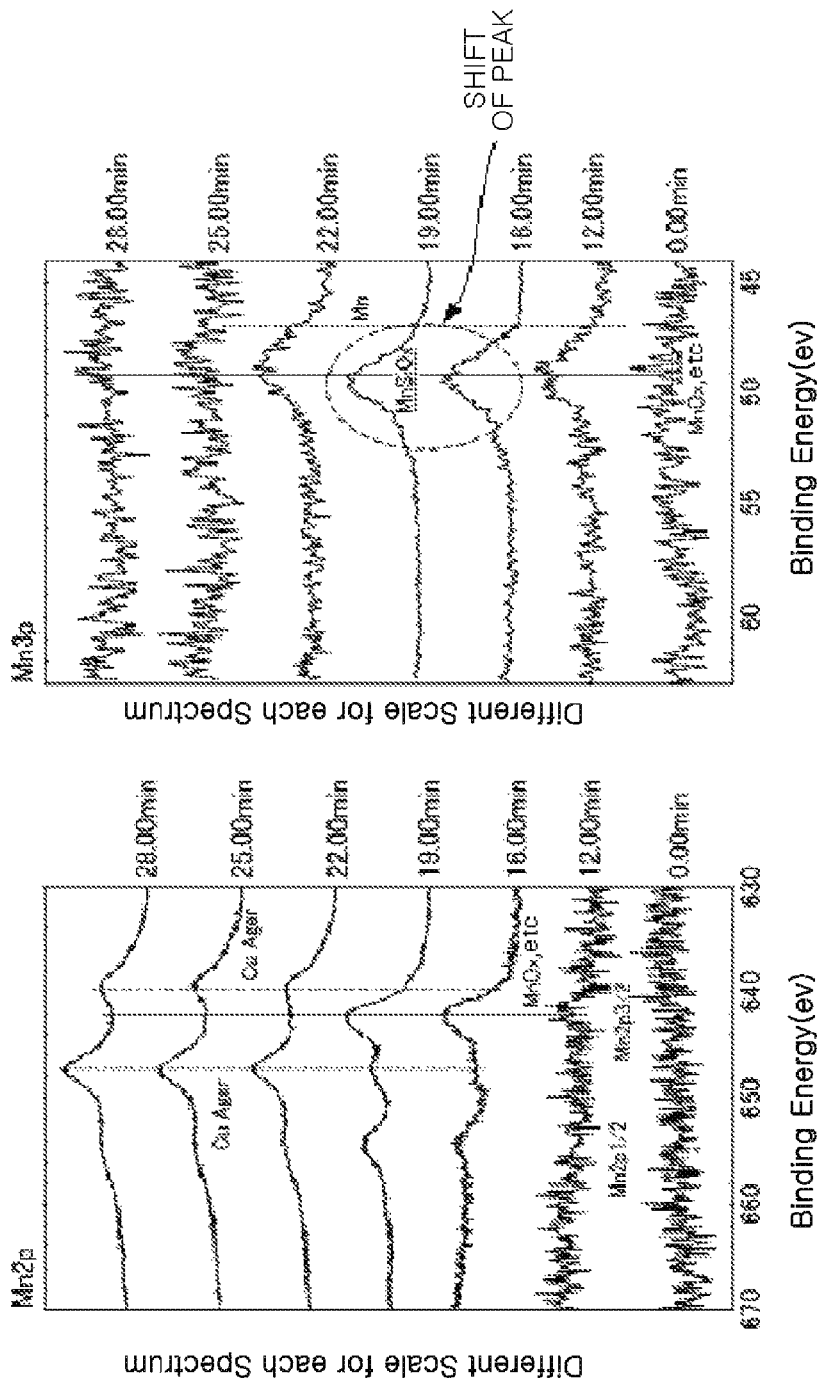
FIG. 11 shows XPS spectra of Mn2p and Mn3p in the Cu/CuO$_x$/MnO$_x$/SiO$_2$ laminated structure of the sample in which the H$_2$ radical process of the test example 1 is performed.
Figure 12:
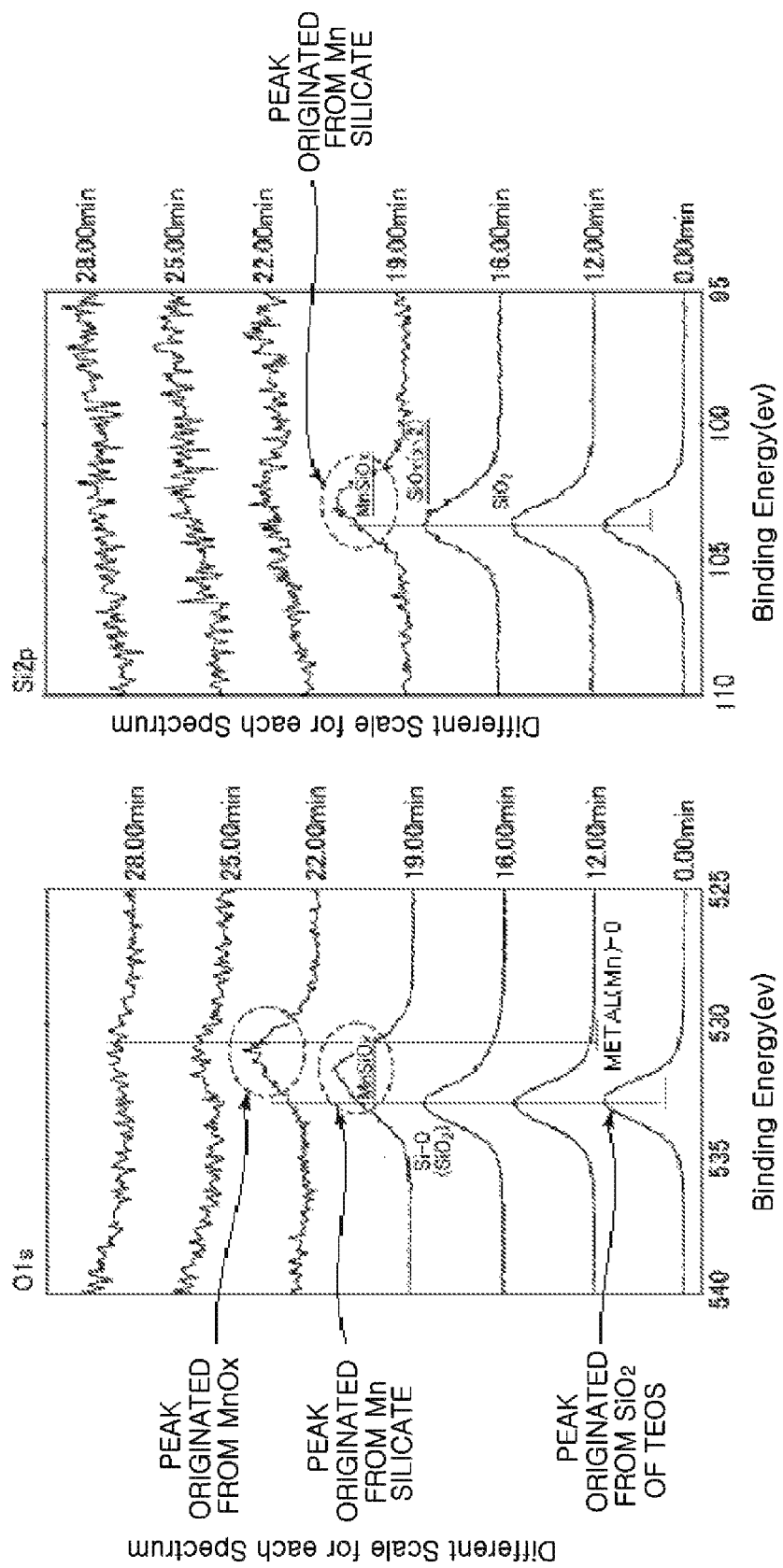
FIG. 12 shows XPS spectra of O1s and Si2p in the Cu/CuO$_x$/MnO$_x$/SiO$_2$ laminated structure of the sample in which the H$_2$ radical process of the test example 1 is performed.

FIG. 9 shows quantitative values of elements with respect to sputtering time (distance in a depth direction) of a sample in which a $H_2$ radical process of the test example 1 is performed. FIG. 10 shows XPS spectra of Cu2p3/2 and Cu LMM in a $Cu/CuO_x/MnO_x/SiO_2$ laminated structure of a sample in which the $H_2$ radical process of the test example 1 is performed. FIG. 11 shows XPS spectra of Mn2p and Mn3p in the $Cu/CuO_x/MnO_x/SiO_2$ laminated structure of the sample in which the $H_2$ radical process of the test example 1 is performed. FIG. 12 shows XPS spectra of O1s and Si2p in the $Cu/CuO_x/MnO_x/SiO_2$ laminated structure of the sample in which the $H_2$ radical process of the test example 1 is performed.

In the sample in which the $H_2$ radical process is performed, as in the case of the sample in which the Ar annealing is performed, a peak is not shown at the position of $CuO_x$ in the $CuO_x$ film formed on the $MnO_x$ film and only a signal of Cu in a metal state is detected as shown in FIG. 10. Therefore, it has been confirmed that $CuO_x$ is reduced to Cu. Further, as in the case of the sample in which the Ar annealing is performed, on the $MnO_x/SiO_2$ interface, a Mn3p peak is shifted to a high binding energy and a Si2p peak is shifted to a low binding energy as shown in FIGS. 11 and 12. Thus, there is a high possibility that Mn silicate is formed. In addition, a peak originated from $MnO_x$ is shown, whereas a peak of metal Mn is not shown, which indicates that $MnO_x$ exists but metal Mn does not exist.

From the above, it has been confirmed that $CuO_x$ on MnO is reduced to Cu regardless of the Ar annealing and the $H_2$ radical process. Further, Mn silicate is formed on the $MnO_x/SiO_2$ interface and $MnO_x$ remains thereon. Moreover, even after the $H_2$ radical process having a strong reducing property, the signal of metal Mn is not shown. This indicates that $MnO_x$ is not reduced to Mn.

Test Example 2

Next, a tape test was performed on two samples (Ar annealing and $H_2$ radical process) used in the test example 1 and a comparative sample in which a conventional CVD-Ru film (thickness of 2.5 nm) was formed as a liner film and, then, an iPVD-Cu film (thickness of 600 nm) was formed.

In the tape test, whether the Cu film was peeled off or not was checked by scratching a surface of the iPVD-Cu film of the sample in a grid-like pattern of 100 cells at an interval of about 2 mm by a diamond pen, adhering an adhesive tape, and peeling off the tape. As a result, the peeling off of the Cu film did not occur in any of the samples. In the sample of the present disclosure in which the Cu film is formed on the $CuO_x/MnO_x$ laminated structure, good adhesivity is ensured by both of the Ar annealing and the $H_2$ radical process. Since the good adhesivity is also ensured by the conventional Cu/Ru/$MnO_x$ laminated structure, it is difficult to clearly compare the adhesivity in the conventional case with that in the present disclosure.

(Film Forming System Suitable for Implementation of the Embodiment)

Figure 13:
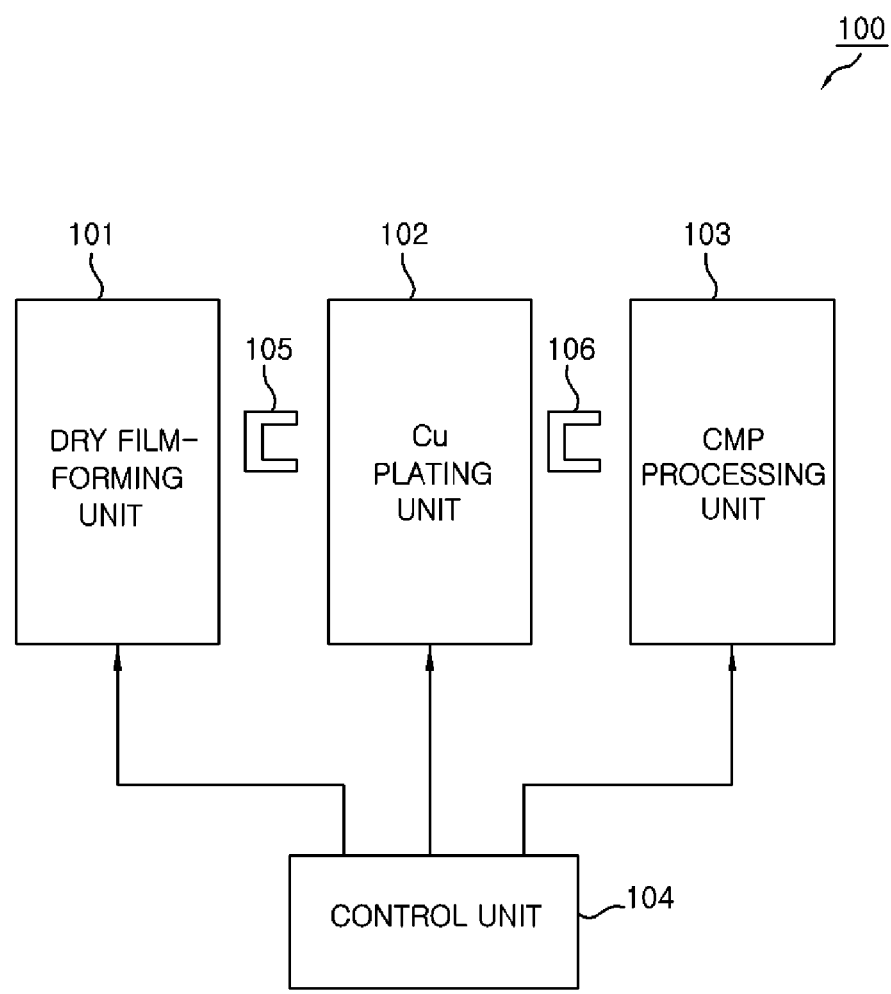
FIG. 13 is a block diagram showing a schematic configuration of a Cu wiring manufacturing system suitable for implementation of the Cu wiring manufacturing method according to the embodiment.
Figure 14:
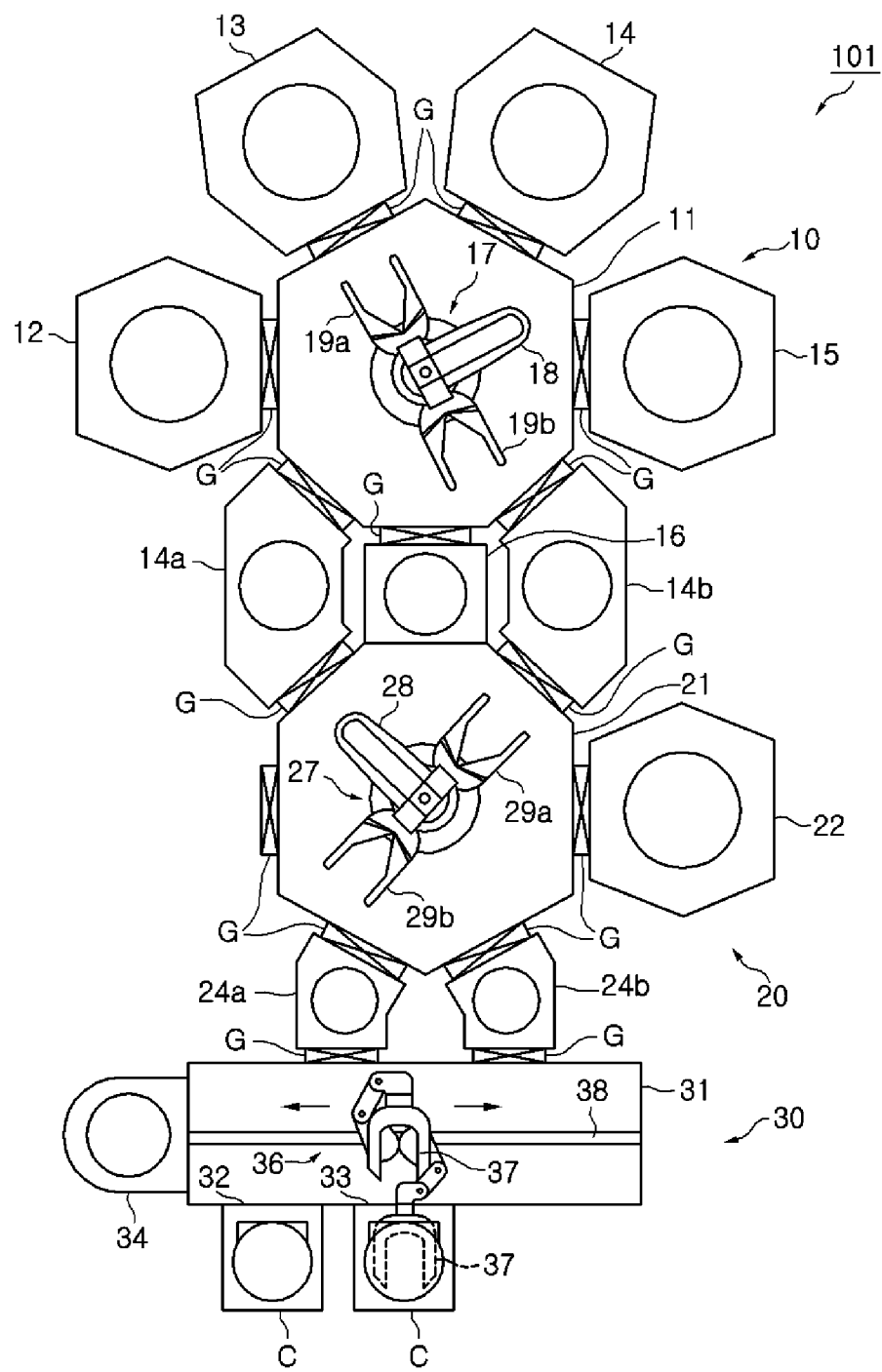
FIG. 14 is a top view showing an example of a dry film-forming unit in the Cu wiring manufacturing system of FIG. 13.
Figure 15:
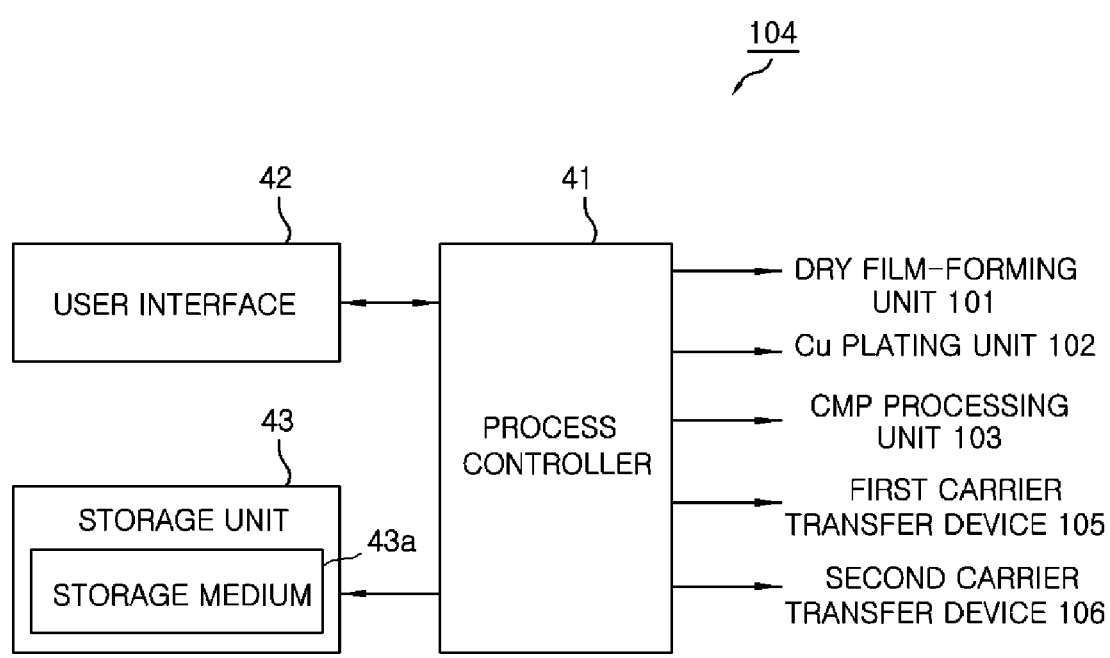
FIG. 15 is a block diagram showing a control unit of the Cu wiring manufacturing system of FIG. 13.

Next, a film forming system suitable for implementation of the Cu wiring manufacturing method according to the embodiment will be described. FIG. 13 is a block diagram showing a schematic configuration of a Cu wiring manufacturing system suitable for implementation of the Cu wiring manufacturing method according to the embodiment. FIG. 14 is a top view showing an example of a dry film-forming unit 101 that is a main unit of the film forming system of FIG. 13. FIG. 15 is a block diagram showing a control unit 104 of the film forming system of FIG. 13.

As shown in FIG. 13, a Cu wiring manufacturing system 100 includes: a dry film-forming unit 101 for performing processes from a degassing process to Cu-based film formation; a Cu plating unit 102 for forming an additional Cu layer; a CMP processing unit 103 for performing a CMP process; a control unit 104 for controlling respective components of the Cu wiring manufacturing system 100; a first carrier transfer device 105 for transferring a carrier C accommodating wafers W between the dry film-forming unit 101 and the Cu plating unit 102; and a second carrier transfer device 106 for transferring the carrier C accommodating wafers W between the Cu plating unit 102 and the CMP processing unit 103.

As shown in FIG. 14, the dry film-forming unit 101 includes: a first processing section 10 for performing the degassing process or the pre-cleaning process, the formation of the $MnO_x$ film, the formation of the $CuO_x$ film, the annealing process or the $H_2$ radical process; a second processing section 20 for forming a Cu-based film; and a loading/unloading section 30.

The first processing section 10 includes a first vacuum transfer chamber 11, a $MnO_x$ film forming apparatus 12, a $CuO_x$ film forming apparatus 13, an annealing/$H_2$ radical processing apparatus 14 and a Cu seed film forming apparatus 15, which are respectively connected to four walls of the first vacuum transfer chamber 11, and degassing/pre-cleaning apparatuses 14a and 14b connected to the other two walls. The annealing/$H_2$ radical processing apparatus 14 is also configured to perform the degassing process or the pre-cleaning process of the wafer. The degassing/pre-cleaning apparatuses 14a, 14b are also configured to perform the Ar annealing or the $H_2$ radical processing. Connected to a wall of the first vacuum transfer chamber 11 between the annealing/$H_2$ radical processing apparatuses 14a and 14b is a delivery chamber 16 through which the wafer W is transferred between the first vacuum transfer chamber 11 and a second vacuum transfer chamber 21.

The $MnO_x$ film forming apparatuses 12, the $CuO_x$ film forming apparatus 13, the annealing/$H_2$ radical processing apparatus 14, the Cu seed film forming apparatus 15, the degassing/pre-cleaning apparatuses 14a, 14b, and the delivery chamber 16 are respectively connected to corresponding sides of the first vacuum transfer chamber 11 through gate valves G. They communicate with or are isolated from the first vacuum transfer chamber 11 by opening or closing the corresponding gate valves G.

An inside of the first vacuum transfer chamber 11 is maintained at a predetermined vacuum atmosphere, and a first transfer mechanism 17 for transferring the wafer W is provided in the first vacuum transfer chamber 11. The first transfer mechanism 17 is provided substantially at the central portion of the first vacuum transfer chamber 11. The first transfer mechanism 17 has a rotatable and extensible/contractible portion 18 which can rotate, extend and contract, and two holding arms 19a and 19b for holding the wafer W which are provided at a leading end of the rotatable and extensible/contractible portion 18. The first transfer mechanism 17 loads and unloads the wafer W into and from the $MnO_x$ film forming apparatus 12, the $CuO_x$ film forming apparatus 13, the annealing/$H_2$ radical processing apparatus 14, the degassing/pre-cleaning apparatuses 14a and 14b, the Cu seed film forming apparatus 15, and the delivery chamber 16.

The second processing section 20 includes a second vacuum transfer chamber 21, and a Cu-based film forming apparatus 22 connected to a wall facing the second vacuum transfer chamber 21.

The degassing/pre-cleaning apparatuses 14a and 14b are connected to two walls of the second vacuum transfer chamber 21 which face the first processing section 10. The delivery chamber 16 is connected to a wall of the second vacuum transfer chamber 21 between the degassing/pre-cleaning apparatuses 14a and 14b. In other words, the degassing/pre-cleaning apparatuses 14a and 4b and the delivery chamber 16 are provided between the first vacuum transfer chamber 11 and the second vacuum transfer chamber 21, and the degassing/pre-cleaning apparatuses 14a and 14b are provided at opposite sides of the delivery chamber 16. The load-lock chambers 24a and 24b that allow atmospheric transfer and vacuum transfer are connected to two walls of the second vacuum transfer chamber 21 which face the loading/unloading section 30. The remaining wall of the second vacuum transfer chamber 21 serves as a preliminary connection port.

The Cu-based film forming apparatus 22, the degassing/pre-cleaning apparatuses 14a and 14b, and the load-lock chambers 24a and 24b are connected to the walls of the second vacuum transfer chamber 21 through respective gate valves G. They communicate with the second vacuum transfer chamber 21 by opening the corresponding gate valves G and are isolated from the second vacuum transfer chamber 21 by closing the corresponding gate valves G. The delivery chamber 16 is connected to the second vacuum transfer chamber 21 with no gate valve therebetween.

An inside of the second vacuum transfer chamber 21 is maintained at a predetermined vacuum atmosphere. In the second vacuum transfer chamber 21, there is provided a second transfer unit 27 for transferring the wafer W with respect to the Cu-based film-forming apparatus 22, the degassing/pre-cleaning apparatuses 14a and 14b, the load-lock chambers 24a and 24b and the delivery chamber 16. The second transfer unit 27 is arranged at a substantially central position in the second vacuum transfer chamber 21. The second transfer unit 27 has a rotatable and extensible/contractible portion 28 which can rotate, extend and contract, and two holding arms 29a and 29b for holding the wafer W which are provided at a leading end of the rotatable and extensible/contractible portion 28. The holding arms 29a and 29b are attached to the rotatable and extensible/contractible portion 28 to face the opposite directions.

The loading/unloading section 30 is provided at a side opposite to a side where the second processing section 20 is provided with the load-lock chambers 24a and 24b interposed therebetween. The loading/unloading section 30 has an atmospheric transfer chamber 31 connected to the load-lock chambers 24a and 24b. At an upper portion of the atmospheric transfer chamber 31, a filter (not shown) for forming a downward flow of a clean air is provided. Gate valves G are provided at a wall between the atmospheric transfer chamber 31 and the load-lock chambers 24a and 24b. Two connection ports 32 and 33 for connecting carriers C each of which accommodates wafers W as substrates to be processed are provided at a wall opposite to the wall of the atmospheric transfer chamber 31 which is connected to the load-lock chambers 24a and 24b. An alignment chamber 34 for performing alignment of the wafer W is provided at a side surface of the atmospheric transfer chamber 31. An atmospheric transfer mechanism 36 for loading and unloading of the wafer W into and from the carrier C and the load-lock chambers 24a and 24b is provided in the atmospheric transfer chamber 31. The atmospheric transfer mechanism 36 has two multi-joint arms and is movable on a rail 38 along the arrangement direction of the carriers C. The atmospheric transfer mechanism 36 is configured to transfer the wafer W mounted on a hand 37 at a leading end of each of the multi-joint arms.

The Cu plating unit 102 includes a Cu plating apparatus and an annealing apparatus and the like associated therewith. The CMP processing unit 103 includes a CMP processing apparatus and an apparatus associated therewith.

As shown in FIG. 15, the control unit 104 includes: a process controller 41 having a microprocessor (computer) for controlling the respective components of the dry film-forming unit 101, the Cu plating unit 102 and the CMP processing unit 103, and the first and the second carrier transfer device 105 and 106; a user interface 42; and a storage unit 43. The user interface 42 includes a keyboard through which an operator inputs a command to manage the Cu wiring manufacturing system 100, a display for visually displaying the operational states of the Cu wiring manufacturing system 100, and the like. The storage unit 43 stores therein control programs, i.e., processing recipes, to be used in realizing various processes performed in the Cu wiring manufacturing system 100 under the control of the process controller 41. The user interface 42 and the storage unit 43 are connected to the process controller 41.

The recipes are stored in a storage medium 43a in the storage unit 43. The storage medium 43a may be a hard disk, a portable medium such as a CD-ROM, a DVD, or the like, or a semiconductor memory such as a flash memory or the like. Alternatively, the recipes may be appropriately transmitted from other devices via, e.g., a dedicated transmission line.

If necessary, a certain recipe is read out from the storage medium 43a in the storage unit 43 in response to an instruction from the user interface 42 and is executed by the process controller 41. Accordingly, a desired process is performed in the Cu wiring manufacturing system 100 under the control of the process controller 41.

Next, the operation of the Cu wiring manufacturing system 100 will be described.

A carrier C accommodating wafers that have been subjected to etching and ashing is transferred to the dry film-forming unit 101 and set in a predetermined position. Next, a wafer W having a recess such as a trench or via is unloaded from the carrier C, and aligned in the alignment chamber 34, and then loaded into the load-lock chamber 24a or 24b by the atmospheric transfer mechanism 36. After the pressure in the load-lock chamber is decreased to a vacuum level substantially equivalent to that in the second vacuum transfer chamber 21, the wafer W is unloaded from the load-lock chamber and loaded into the degassing/pre-cleaning apparatus 14a or 14b through the second vacuum transfer chamber 21 by the second transfer mechanism 27. Thus, the wafer W is subjected to the degassing process or the pre-cleaning process. Thereafter, the wafer W is unloaded from the degassing/pre-cleaning apparatus 14a or 14b and loaded into the $MnO_x$ film forming apparatus 12 through the first vacuum transfer chamber 11 by the first transfer mechanism 17. Then, as described above, the $MnO_x$ film is formed by ALD and a self-formed barrier film is formed.

After the $MnO_x$ film is formed, the wafer W is transferred to the $CuO_x$ film forming apparatus 13 by the first transfer mechanism 17, and a $CuO_x$ film is formed on the $MnO_x$ film by CVD or ALD as described above. Then, the wafer W is unloaded from the $CuO_x$ film forming apparatus 13 and loaded into the annealing/$H_2$ radical processing apparatus 14 by the first transfer mechanism 17. Then, the annealing process or the $H_2$ radical process (annealing process that leads to $H_2$ radical process) is performed as described above, and $CuO_x$ is reduced to Cu by the reduction-oxidation between $MnO_x$ and $CuO_x$ as described above. Next, the wafer W is unloaded from the annealing/$H_2$ radical processing apparatus 14 and transferred to the Cu seed film forming apparatus 15 by the first transfer unit 17. Then, a Cu seed is formed by iPVD. Thereafter, the Cu reflow annealing is performed by the degassing/pre-cleaning apparatus 14a or 14b. Thereafter, the wafer W is unloaded and transferred to the Cu-based film forming apparatus 22 by the second transfer unit 27 of the second vacuum transfer chamber 21. The aforementioned Cu-based film (Cu or Cu alloy) is formed by iPVD and fills the recess such as the trench or via. The delivery chamber 16 can be used as a buffer in which the wafer W is temporarily held.

After the Cu-based film is formed, the wafer W is transferred into the load-lock chamber 24a or 24b by the second transfer unit 27. After the pressure in the load-lock chamber is returned to the atmospheric pressure, the wafer W having the Cu-based film is unloaded by the atmospheric transfer unit 36 and returned to the carrier C. These processes are repeated for all of the wafers W in the carrier.

Next, the carrier C accommodating therein the wafers W that has been subjected to the Cu-based film formation is transferred to the Cu plating unit 102 by the first carrier transfer device 105. An additional Cu layer is formed on the wafer W having the Cu-based film formed thereon by Cu plating, and an annealing process is performed.

Thereafter, the carrier C accommodating the wafer W that has been subjected to the additional Cu layer formation is transferred to the CMP processing unit 103 by the second carrier transfer device 106, and a CMP process is performed.

The Cu wiring manufacturing system 100 can perform the processes from the degassing process or the pre-cleaning process to the CMP process on the wafer that has been subjected to etching/ashing. In the dry film-forming unit 101, the degassing process or the pre-cleaning process, the $MnO_x$ film formation, the $CuO_x$ film formation, the annealing process ($H_2$ radical process), the Cu seed film formation, the Cu reflow annealing process, and the Cu-based film formation are performed in a vacuum state on the wafer that has been subjected to etching/ashing without exposure to an atmosphere. Accordingly, the oxidation of the films during the above processes can be prevented and a high-performance Cu wiring can be manufactured.

The dry film-forming apparatus 101 includes the $MnO_x$ film forming apparatus 12 and the $CuO_x$ film forming apparatus 13 which are provided separately. However, the dry film-forming apparatus 101 may include a single film forming apparatus for forming a $MnO_x$ film and a $CuO_x$ film. By performing in-situ the $MnO_x$ film formation using ALD and the $CuO_x$ film formation using CVD or ALD by the single film forming apparatus, the $MnO_x$ film formation and the $CuO_x$ film formation can be consecutively performed while ensuring a high throughput.

(iPVD Apparatus)

Figure 16:
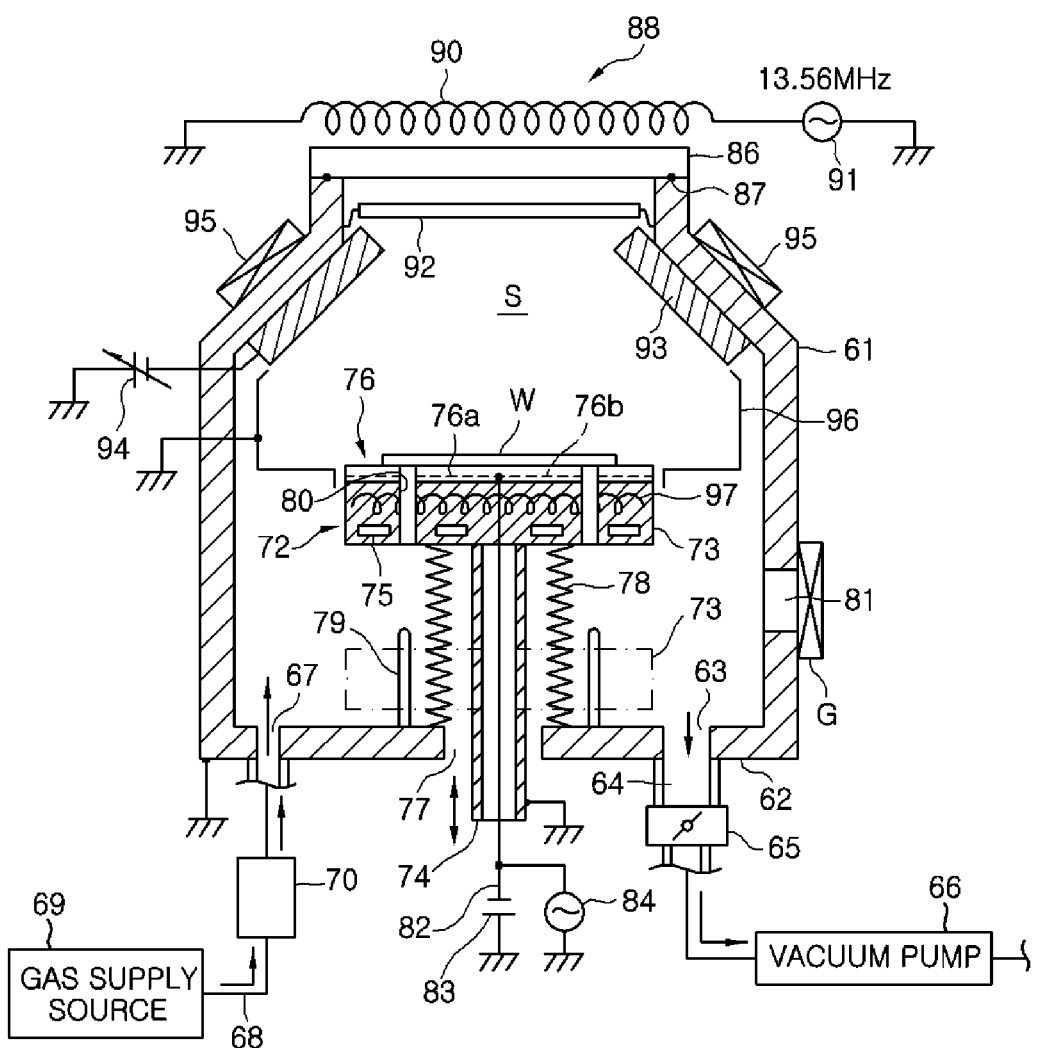
FIG. 16 is a cross sectional view showing an example of an iPVD apparatus suitable for a Cu-based film forming apparatus.

Hereinafter, an ICP (Inductively Coupled Plasma) plasma sputtering apparatus will be described as an example of an iPVD apparatus that can be preferably used as the Cu-based film forming apparatus 22 and the Cu seed forming apparatus 15 in the Cu wiring manufacturing system 100. FIG. 16 is a cross sectional view showing the ICP plasma sputtering apparatus.

As shown in FIG. 16, the iPVD apparatus includes a processing chamber 61 that is grounded and made of a metal such as aluminum or the like. A gas exhaust port 63 and a gas inlet port 67 are provided at a bottom portion 62 of the processing chamber 61. A gas exhaust line 64 is connected to the gas exhaust port 63 and also connected to a throttle valve 65 and a vacuum pump 66 for pressure control. A gas supply line 68 is connected to the gas inlet port 67 and also connected to a gas supply source 69 for supplying a plasma excitation gas such as Ar gas or the like or another required gas such as $N_2$ gas or the like. A gas control unit 70 including a gas flow rate controller, a valve and the like is installed in the gas supply line 68.

Provided in the processing chamber 61 is a mounting mechanism 72 for mounting thereon a wafer W as a substrate to be processed. The mounting mechanism 72 includes a disc-shaped mounting table 73 and a hollow cylindrical column 74 for supporting the mounting table 73. The mounting table 73 is made of a conductive material, e.g., an aluminum alloy or the like, and grounded via the column 74. The mounting table 73 has therein a cooling jacket 75 and thus is cooled by a coolant flowing through the cooling jacket 75. Further, a resistance heater 97 coated with an insulating material is buried above the cooling jacket 75 in the mounting table 73. The temperature of the wafer W can be controlled to a predetermined temperature by controlling the supply of power to the resistance heater 97 and the supply of coolant to the cooling jacket 75.

An electrostatic chuck 76 including a dielectric member 76a and an electrode 76b embedded in the dielectric member 76a is provided on a top surface of the mounting table 73 to electrostatically attract and hold the wafer W. A lower portion of the column 74 extends downward through an insertion hole 77 formed at the center of the bottom portion of the processing chamber 61. The column 74 is vertically movable by an elevation unit (not shown) to move the entire mounting mechanism 72 up and down.

An extensible/contractible metal bellows 78 is provided to surround the column 74. The metal bellows 78 has a top end attached to the bottom surface of the mounting table 73 and a bottom end attached to the top surface of the bottom portion 62 of the processing chamber 61. Accordingly, the mounting mechanism 72 can be vertically moved while maintaining the airtightness in the processing chamber 61.

A plurality of, e.g., three (only two are shown) support pins 79 is uprightly mounted on the bottom portion 62, and pin insertion holes 80 are formed in the mounting table 73 to correspond to the support pins 79. Therefore, when the mounting table 73 is lowered, the top end portions of the support pins 79 pass through the pin insertion holes 80 to receive the wafer W, so that the wafer W is transferred to/from a transfer arm (not shown) which comes from outside. A loading/unloading port 81 through which the transfer arm moves in and out is provided at a lower sidewall of the processing chamber 61, and an openable/closeable gate valve G is provided at the loading/unloading port 81.

A chuck power supply 83 is connected to the electrode 76b of the electrostatic chuck 76 through a power supply line 82. By applying a DC voltage from the chuck power supply 83 to the electrode 76b, the wafer W is attracted and held by an electrostatic force. A high frequency bias power supply 84 is connected to the power supply line 82, so that a high frequency bias power is supplied to the electrode 76b of the electrostatic chuck 76 through the power supply line 82 to apply a bias power to the wafer W. The frequency of the high frequency power is preferably in a range from 400 kHz to 60 MHz, e.g., 13.56 MHz.

A transmitting plate 86 made of a dielectric material is hermitically provided at a ceiling portion of the processing chamber 61 through a seal member 87. A plasma generating source 88 for generating a plasma from a plasma excitation gas in a processing space S of the processing chamber 61 is provided above the transmitting plate 86.

The plasma generating source 88 has an induction coil 90 disposed to correspond to the transmitting plate 86. A high frequency power supply 91 for plasma generation, which has a high frequency of, e.g., 13.56 MHz, is connected to the induction coil 90. Accordingly, a high frequency power is introduced into the processing space S through the transmitting plate 86, and an induced electric field is formed in the processing space S.

A baffle plate 92 made of a metal is provided directly under the transmitting plate 86 to diffuse the introduced high frequency power. An annular (truncated cone-shaped) target 93 having an inwardly upwardly inclined cross section and made of Cu or Cu alloy is disposed below the baffle plate 92 to surround an upper region of the processing space S. A variable voltage DC power supply 94 is connected to the target 93 to apply a DC power for attracting Ar ions. Alternatively, an AC power supply may be used instead of the DC power supply.

A magnet 95 is provided at an outer peripheral side of the target 93. The target 93 is sputtered by Ar ions in the plasma, so that Cu or Cu alloy is released from the target 93 and they are mostly ionized while passing through the plasma.

A cylindrical protection cover member 96 made of, e.g., aluminum or copper, is provided below the target 93 to surround the processing space S. The protection cover member 96 is grounded. An inner edge of the protection cover member 96 is disposed to surround the outer peripheral side of the mounting table 73.

In the iPVD apparatus configured as described above, the wafer W is loaded into the processing chamber 61 and mounted on the mounting table 73. Then, the wafer W is electrostatically attracted and held on the electrostatic chuck 76. The following operations are performed under the control of the control unit 104. At this time, the temperature of the mounting table 73 is controlled by controlling the supply of coolant to the cooling jacket 75 or the supply of power to the resistance heater 97 based on the temperature detected by a thermocouple (not shown).

First, the processing chamber 61 is set to a predetermined vacuum state by operating the vacuum pump 66. Then, the pressure in the processing chamber 61 is maintained at the predetermined vacuum level by controlling the throttle valve 65 while supplying Ar gas into the processing chamber 61 at a predetermined flow rate by controlling the gas control unit 70. Next, a DC power is applied to the target 93 from the variable DC power supply 94, and a high frequency power (plasma power) is supplied to the induction coil 90 from the high frequency power supply 91 of the plasma generating source 88. A predetermined high frequency bias power is supplied from the high frequency bias power supply 84 to the electrode 76b of the electrostatic chuck 76.

Accordingly, in the processing chamber 61, an Ar plasma is generated by the high frequency power supplied to the induction coil 90. Ar ions in the Ar plasma are attracted toward the target 93 by the DC voltage applied to the target 93 and collide with the target 93. The target 93 is sputtered and Cu particles are emitted. At this time, the amount of particles emitted from the target 93 is optimally controlled by the DC voltage applied to the target 93.

The particles from the sputtered target 93 are mostly ionized while passing through the plasma. The ionized particles and electrically neutral atoms are mixed and are scattered downward. At this time, the particles can be ionized with high efficiency by increasing a density of the plasma by increasing the pressure in the processing chamber 61. The ionization rate at this time is controlled by the high frequency power supplied from the high frequency power supply 91.

When the ions are introduced into an ion sheath region formed above the wafer W with a thickness of about a few mm by the high frequency bias power applied from the high frequency bias power supply 84 to the electrode 76b of the electrostatic chuck 76, the ions are attracted with strong directivity toward the wafer W and deposited on the wafer W. As a consequence, the Cu-based film is formed.

When the Cu film is formed, the wafer temperature is set to a high level (in a range from 65° C. to 400° C.), and the bias power applied from the high frequency bias power supply 84 to the electrode 76b of the electrostatic chuck 76 is controlled. With such control, the formation of the Cu film and the etching using Ar are controlled to improve the mobility of Cu. As a result, Cu can be filled with good fillability even in a trench or hole having a small opening.

(ALD apparatus)

Figure 17:
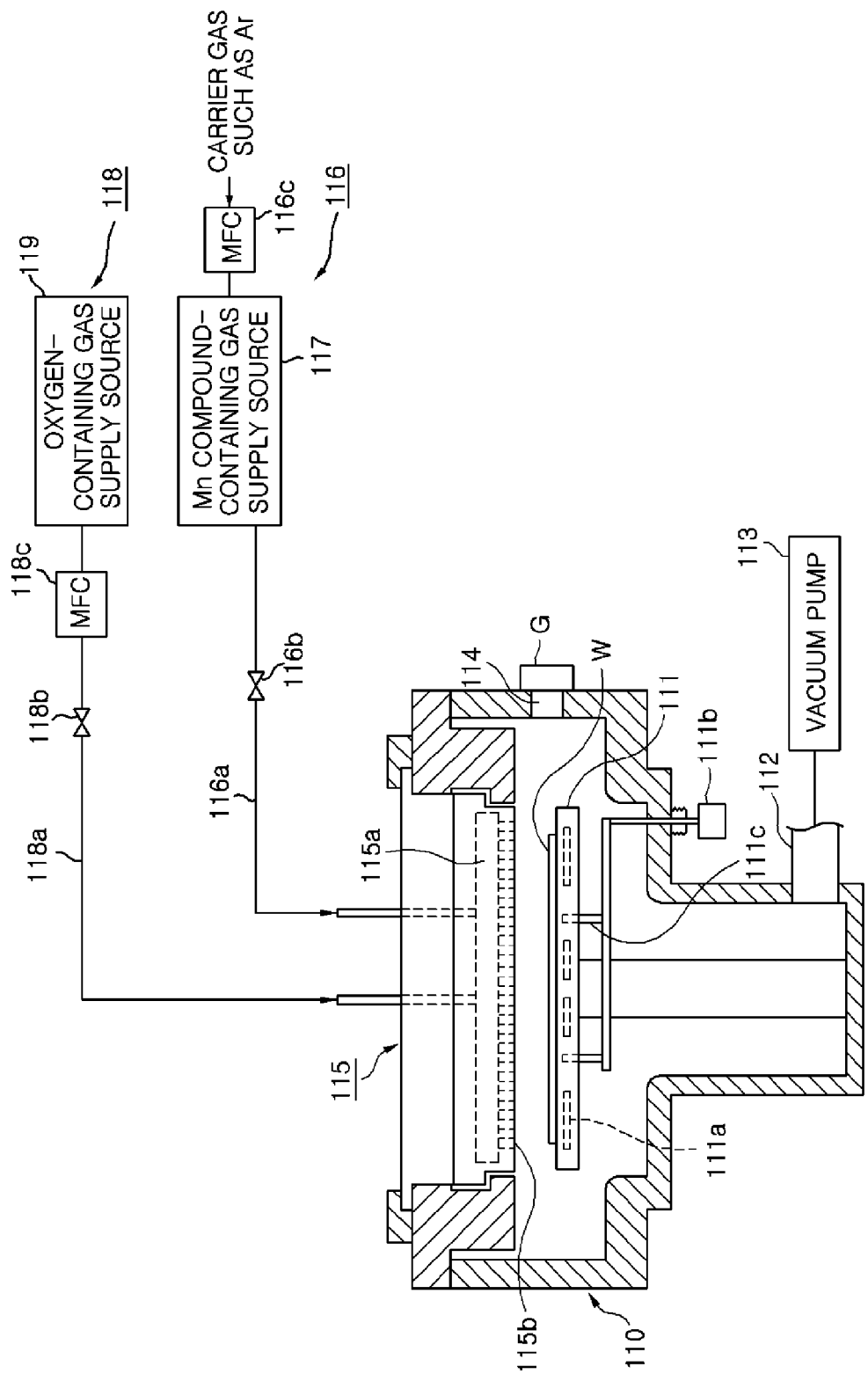
FIG. 17 is a cross sectional view showing an example of an ALD apparatus suitable for a MnO$_x$ film forming apparatus.

Next, an ALD apparatus that can be preferably used as the $MnO_x$ film forming apparatus 12 used for the Cu wiring manufacturing system 100 will be described. FIG. 17 is a cross sectional view showing an example of the ALD apparatus for forming a $MnO_x$ film by ALD. The ALD apparatus can also be used as the $CuO_x$ film forming apparatus 13 for forming a $CuO_x$ film by CVD or ALD by changing a gas supply system and adding a throttle valve to the gas exhaust line.

As shown in FIG. 17, the ALD apparatus includes a processing chamber 110. A mounting table 111 for horizontally mounting thereon the wafer W is provided in the processing chamber 110. The mounting table 111 has therein a heater 111a as a unit for controlling a wafer temperature. The mounting table 111 is provided with three elevating pins (only two are shown) 111c that can be vertically moved by an elevating mechanism 111b. The wafer W is transferred between the mounting table 111 and a wafer transfer unit (not shown) through the elevating pins 111c.

One end of the gas exhaust line 112 is connected to the bottom portion of the processing chamber 110 and the other end of the gas exhaust line 112 is connected to a vacuum pump 113. A transfer port 114 that is opened and closed by the gate valve G is formed at a sidewall of the processing chamber 110.

A gas shower head 115 is provided at the ceiling portion of the processing chamber 110 to face the mounting table 111. The gas shower head 115 has a gas diffusion space 115a. A gas supplied into the gas diffusion space 115 is supplied into the processing chamber 110 through a plurality of gas injection openings 115b.

The gas shower head 115 is connected to a Mn compound-containing gas supply line system 116 for introducing a Mn compound-containing gas into the gas diffusion space 115a. The Mn compound-containing gas supply line system 116 includes a gas supply line 116a. A valve 116b, a Mn compound-containing gas supply source 117 and a mass flow controller 116c are provided at an upstream side of the gas supply line 116a. A Mn compound-containing gas is supplied from the Mn compound-containing gas supply source 117 by a bubbling method. Ar gas or the like may be used as a carrier gas for bubbling. The carrier gas also serves as a purge gas.

The gas shower head 115 is connected to an oxygen-containing gas supply line system 118 for introducing an oxygen-containing gas into the gas diffusion space 115a. The oxygen-containing gas supply line system 118 includes a gas supply line 118a. An oxygen-containing gas supply source 119 is connected to an upstream side of the gas supply line 118a via a valve 118b and a mass flow controller 118c. An oxygen-containing gas, e.g., $H_2O$ gas, $N_2O$ gas, $NO_2$ gas, NO gas, $O_2$ gas, $O_3$ gas or the like, is supplied from the oxygen-containing gas supply source 119. The oxygen-containing gas supply line system 118 can supply Ar gas or the like as a purge gas.

In the present embodiment, the gas diffusion space 115a of the gas shower head 115 is used for both of the Mn compound-containing gas and the oxygen-containing gas and they are alternately supplied into the processing chamber 110 through the gas injection openings 115b. However, a gas diffusion space for a Mn compound-containing gas and a gas diffusion space for an oxygen-containing gas may be separately provided in the gas shower head 115 so that they can be separately supplied into the processing chamber 110.

In the ALD apparatus configured as described above, the wafer W is loaded into the processing chamber 110 through the transfer port 114 and mounted on the mounting table 111 controlled to a predetermined temperature. Then, a $MnO_x$ film having a predetermined film thickness is formed by ALD in which the supply of the Mn compound-containing gas from the Mn compound-containing gas supply line system 116 and the supply of the oxygen-containing gas from the oxygen-containing gas supply line system 118 are repeated multiple times with a process of purging the inside of the processing chamber 110 interposed between the supply of the Mn compound-containing gas and the supply of the oxygen-containing gas, while exhausting the processing chamber 110 to vacuum. Upon completion of the film formation, the processed wafer W is unloaded through the transfer port 114.

In the case of using the ALD apparatus for the $CuO_x$ film formation, a Cu compound-containing gas supply line system including a Cu compound gas supply source for supplying a Cu compound-containing gas is used instead of the Mn compound-containing gas supply line system 116. The $CuO_x$ film is formed by CVD in which the supply of the Cu compound-containing gas and the supply of oxygen-containing gas are simultaneously performed or by ALD in which the supply of the Cu compound-containing gas and the supply of the oxygen-containing gas are repeated multiple times with a process of purging the inside of the processing chamber 110 interposed between the supply of the Cu compound-containing gas and the supply of the oxygen-containing gas.

Figure 18:
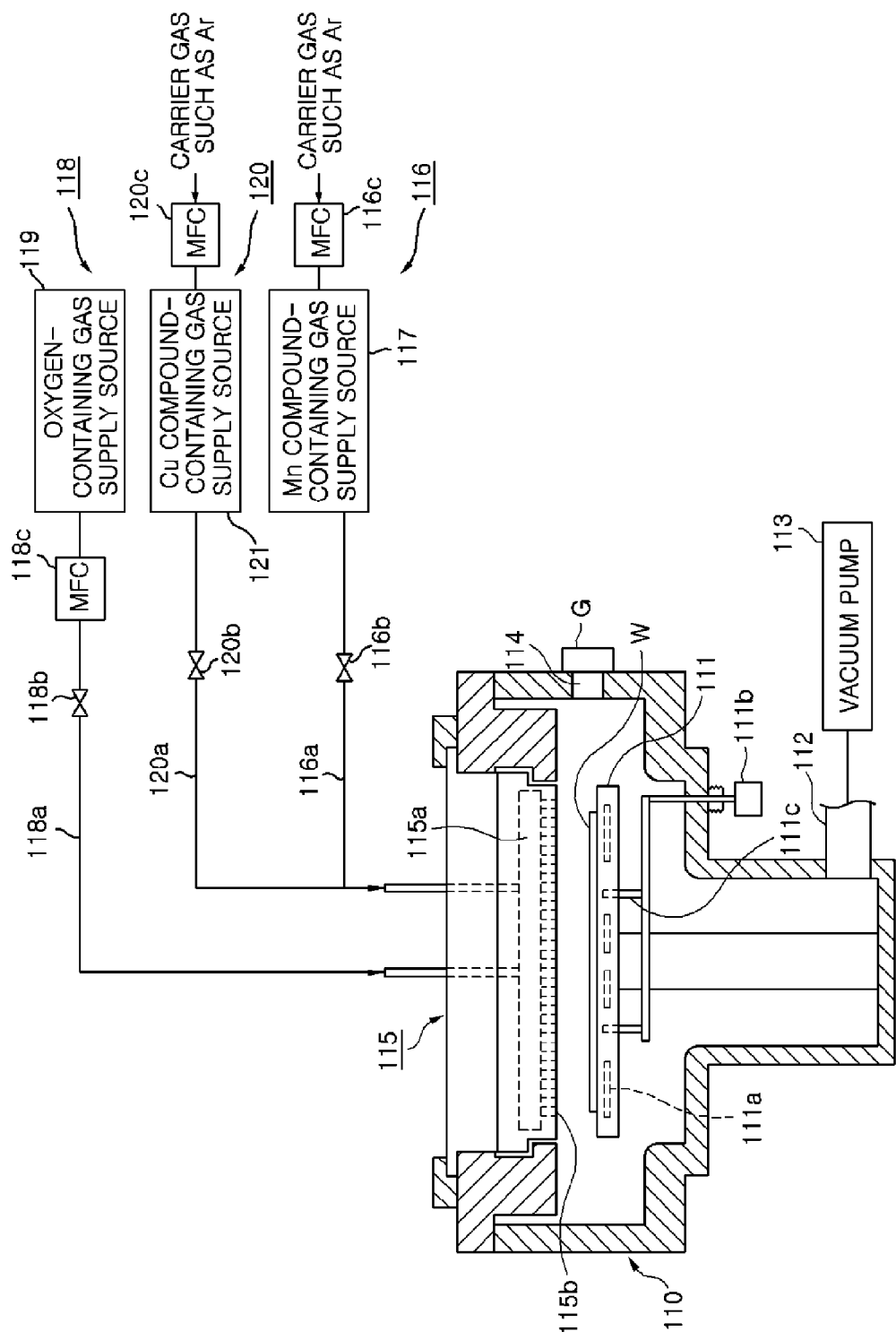
FIG. 18 is a cross sectional view showing an example of an ALD apparatus for consecutively performing formation of a MnO$_x$ film and formation of a CuO$_x$ film in a same processing chamber by using ALD.

Next, an example of the ALD apparatus capable of consecutively performing the $MnO_x$ film formation and the $CuO_x$ film formation in the same processing chamber by ALD will be described with reference to FIG. 18. The ALD apparatus of FIG. 18 is realized by adding a Cu compound-containing gas supply line system 120 for introducing a Cu compound-containing gas into the gas shower head 115 to the ALD apparatus of FIG. 17. The Cu compound-containing gas supply line system 120 includes a gas supply line 120a. A valve 120b, a Cu compound-containing gas supply source 121, and a mass flow controller 120c are connected to an upstream side of the gas supply line 120a. A Cu compound-containing gas is supplied from the Cu compound-containing gas supply source 121 by a bubbling method. As for a carrier gas for bubbling, Ar gas or the like may be used. The carrier gas also serves as a purge gas.

In the ALD apparatus configured as described above, as in the case of the apparatus of FIG. 17, the wafer W is mounted on the mounting table 111 in the processing chamber 110 and a $MnO_x$ film is formed by ALD. Then, a $CuO_x$ film having a predetermined film thickness is formed on the MnO film by ALD in which the supply of the Cu compound-containing gas from the Cu compound-containing gas supply line system 120 and the supply of the oxygen-containing gas from the oxygen-containing gas supply line system 118 are repeated multiple times with a process of purging the inside of the processing chamber 110 interposed between the supply of the Cu compound-containing gas and the supply of the oxygen-containing gas.

The $MnO_x$ film and the $CuO_x$ film may be simply laminated. However, in order to improve the adhesivity therebetween, a $CuMnO_x$ film may be provided as a mixing layer between the $MnO_x$ film and the $CuO_x$ film. In that case, the processing is repeated in the order of the supply of the manganese compound-containing gas, the purge of the inside of the processing chamber, the supply of the oxygen-containing gas, the purge of the inside of the processing chamber, the supply of the Cu compound-containing gas, the purge of the inside of the processing chamber, the supply of the oxygen-containing gas, and the purge of the inside of the processing chamber.

(Annealing Apparatus)

Next, an example of the annealing/$H_2$ radical processing apparatus used for the Cu wiring manufacturing system 100 will be described.

As described above, the annealing/$H_2$ radical processing apparatus performs the annealing process after the $CuO_x$ film formation. The annealing/$H_2$ radical processing apparatus includes an annealing apparatus for simply performing an annealing process or a $H_2$ radical processing apparatus for performing reduction by using $H_2$ radicals during the annealing process. Therefore, when the film thickness of the $CuO_x$ film is comparatively thin, the annealing apparatus is used. When the film thickness of the $CuO_x$ film is comparatively thick, the $H_2$ radical processing apparatus is used.

Figure 19:
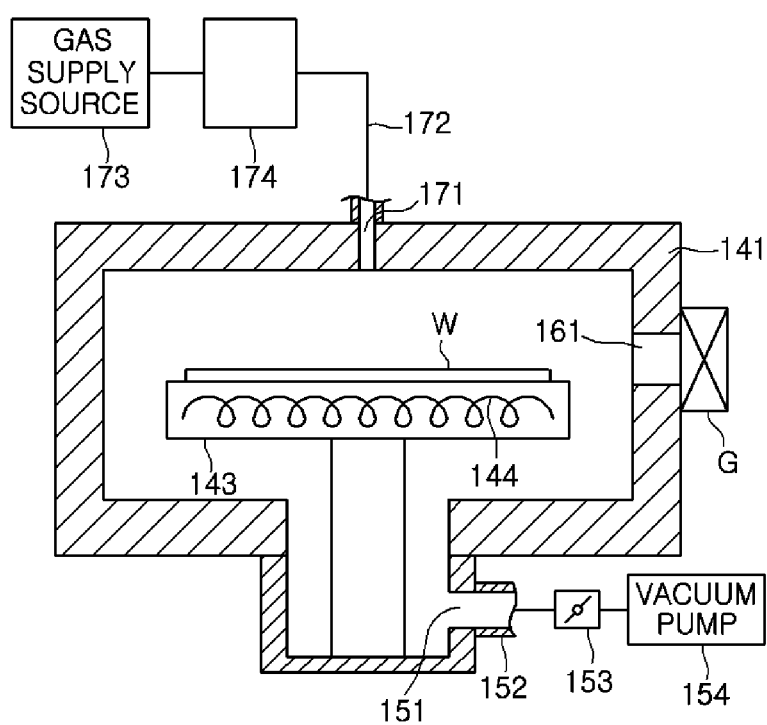
FIG. 19 is a cross sectional view showing an example of an annealing apparatus for performing an annealing process after the formation of the CuO$_x$ film.

FIG. 19 is a cross sectional view showing an example of the annealing apparatus. The annealing apparatus includes a cylindrical processing chamber 141 made of, e.g., aluminum or the like. The processing chamber 141 has therein a mounting table 143 made of ceramic, e.g., AlN or the like, and configured to mount thereon a wafer W. The mounting table 143 has therein a heater 144. The heater 144 generates heat by power supplied from a heater power supply (not shown). The mounting table 143 is provided with three wafer support pins (not shown) for transferring a wafer. The three wafer support pins can protrude beyond and retreat below the surface of the mounting table 143.

A gas exhaust port 151 is provided at the bottom portion of the processing chamber 141. A gas exhaust line 152 is connected to the gas exhaust port 151. The gas exhaust line 152 is connected to a throttle valve 153 and a vacuum pump 154 for pressure control, so that the processing chamber 141 can be exhausted to vacuum. A wafer loading/unloading port 161 is formed at the sidewall of the processing chamber 141. The wafer loading/unloading port 161 can be opened/closed by a gate valve G. The wafer W is loaded and unloaded in a state where the gate valve G is opened.

A gas inlet port 171 is formed at a central portion of a ceiling wall of the processing chamber 141. A gas supply line 172 is connected to the gas inlet port 171 and also connected to a gas supply source 173 for supplying an inert gas such as Ar gas or the like which is used for the annealing process. A gas control unit 174 including a gas flow rate controller, a valve and the like is installed in the gas supply line 172.

In the annealing apparatus configured as described above, the gate valve G is opened and the wafer W is mounted on the mounting table 143. Then, the gate valve G is closed, and the processing chamber 141 is evacuated by the vacuum pump 154 so that the pressure in the processing chamber 141 is controlled to a predetermined level. At the same time, the wafer W mounted on the mounting table 143 is heated to a predetermined temperature by the heater 144. Then, an inert gas such as Ar gas or the like is supplied into the processing chamber 141 from the gas supply source 173 through the gas supply line 172 and the gas supply port 171. The annealing process is performed on the wafer W on which the $CuO_x$ film is formed. Further, the oxidation-reduction reaction between $MnO_x$ and $CuO_x$ occurs.

Figure 20:
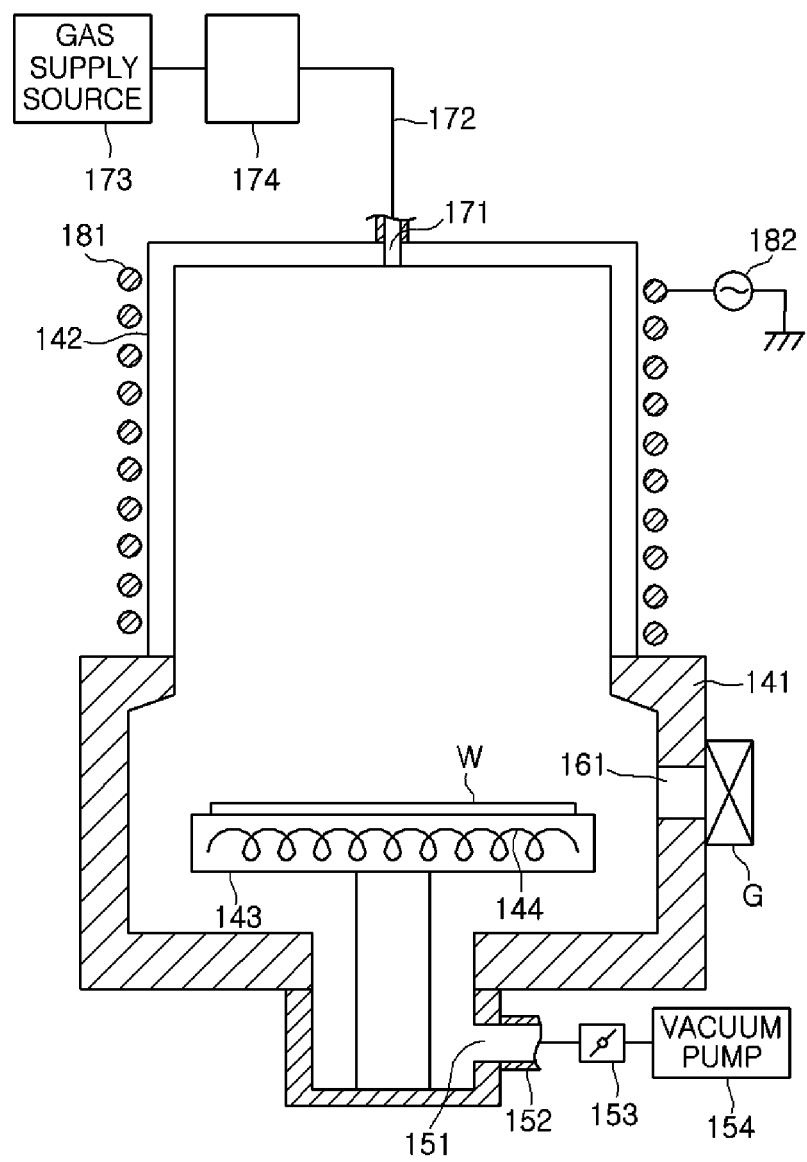
FIG. 20 is a cross sectional view showing an example of a H$_2$ radical processing apparatus for performing a H$_2$ radical process during the annealing process performed after the formation of the CuO$_x$ film.

FIG. 20 is a cross sectional view showing an example of the $H_2$ radical processing apparatus used as the annealing/$H_2$ radical processing apparatus. The generation of $H_2$ radicals in the processing chamber by the remote plasma process will be described as an example.

The $H_2$ radical processing apparatus includes the same processing chamber 141 as that of the annealing apparatus shown in FIG. 19 and a cylindrical bell jar 142 made of a dielectric material and provided on the processing chamber 141. The bell jar 142 has a diameter smaller than that of the processing chamber 141. A wall of the processing chamber 141 and a wall of the bell jar 142 are hermetically sealed. The inside of the processing chamber 141 and the inside of the bell jar 142 communicate with each other.

As in the case of the annealing apparatus shown in FIG. 19, a mounting table 143 made of ceramic, e.g., AlN or the like, is provided in the processing chamber 141 and mounts thereon a wafer W. The mounting table 143 has therein a heater 144. The mounting table 143 is provided with three wafer support pins for transferring a wafer. A gas exhaust port 151, a gas exhaust line 152, a throttle valve 153, and a vacuum pump 154 are provided at the bottom portion of the processing chamber 141. A wafer loading/unloading port 161 is formed at the sidewall of the processing chamber 141. The wafer loading/unloading port 161 can be opened/closed by a gate valve G.

A gas inlet port 171 is formed at a central portion of a ceiling wall of the bell jar 142. A gas supply line 172 is connected to the gas inlet port 171 and also connected to a gas supply source 173. The gas supply source 173 is configured to supply an inert gas or hydrogen gas used for the $H_2$ radical process. A gas control unit 174 including a gas flow rate controller, a valve and the like is installed in the gas supply line 172.

A coil 181 is wound as an antenna around the bell jar 142. A high frequency power supply 182 is connected to the coil 181. By supplying a high frequency power to the coil 181 while supplying hydrogen gas and an inert gas into the bell jar 142, an inductively coupled plasma is generated in the bell jar 142 and $H_2$ radicals are supplied to the wafer W in the processing chamber 141.

In the $H_2$ radical processing apparatus configured as described above, the gate valve G is opened and the wafer W is mounted on the mounting table 143. Then, the gate valve G is closed, and the processing chamber 141 and the bell jar 142 are evacuated by the vacuum pump 154 so that the pressures in the processing chamber 141 and the bell jar 142 are controlled to a predetermined level. At the same time, the wafer W mounted on the mounting table 143 is heated to a predetermined temperature by the heater 144.

Then, an inert gas and hydrogen gas used for the $H_2$ radical process are introduced into the bell jar 142 and the processing chamber 141 from the gas supply source 173 through the gas supply line 172 and the gas supply port 171 and, also, a high frequency power is supplied from the high frequency power supply 182 to the coil 181. Accordingly, the inert gas and the hydrogen gas are excited and an inductively coupled plasma is generated in the bell jar 142. The inductively coupled plasma thus generated is introduced into the processing chamber 141. As a consequence, the $H_2$ radical process is performed as the annealing process on the wafer W on which the $CuO_x$ film is formed. Further, the oxidation-reduction reaction between $MnO_x$ and $CuO_x$ occurs and the reduction of the $CuO_x$ film is promoted.

(Other Applications)

While the embodiment of the present disclosure has been described, the present invention may be variously modified without being limited to the above embodiment. For example, the dry film-forming unit is not limited to one shown in FIG. 14 in which the processes up to the Cu-based film formation are performed in a single processing unit, and may include a processing unit of performing processes from the degassing process or the pre-cleaning process to the $MnO_x$ film formation and a processing unit of performing processes from the $CuO_x$ film formation to the Cu-based film formation. This is because when the wafer is exposed to an atmosphere after the $MnO_x$ film formation, the effect of the exposure to an atmosphere can be reset by the $CuO_x$ film formation and the annealing process ($H_2$ radical process) which will be performed later.

In the above embodiment, the example in which the method of the present disclosure is applied to the wafer having a trench and a via has been described. However, the present disclosure may also be applied to the case in which a wafer has either one of a trench or a via. Further, the method of the present disclosure may be applied to the manufacture of Cu wiring in devices of various structures such as a 3D mounting structure or the like other than a single damascene structure and a dual damascene structure.

Although a semiconductor wafer has been described as an example of a substrate to be processed in the above embodiment, the semiconductor wafer may include a compound semiconductor such as GaAs, SiC, GaN or the like as well as a silicon substrate. The present invention may also be applied to a ceramic substrate, a glass substrate for use in a FPD (flat panel display) such as a liquid crystal display or the like, or the like without being limited to a semiconductor wafer.

While the disclosure has been shown and described with respect to the embodiments, it will be understood by those skilled in the art that various changes and modifications may be made without departing from the scope of the disclosure as defined in the following claims.

What is claimed is:

1. A Cu wiring manufacturing method for manufacturing Cu wiring that fills a recess formed in a predetermined pattern on a surface of an interlayer insulating film of a substrate, the method comprising:
    forming a $MnO_x$ film that becomes a self-formed barrier film by reaction with the interlayer insulating film at least on a surface of the recess by ALD;
    forming a $CuO_x$ film that becomes a liner film on a surface of the $MnO_x$ film by CVD or ALD;
    performing an annealing process on the substrate on which the $CuO_x$ film is formed and reducing the $CuO_x$ film to a Cu film by oxidation-reduction reaction between the $MnO_x$ film and the $CuO_x$ film; and
    forming a Cu-based film on the Cu film obtained by reducing the $CuO_x$ film by PVD to fill the Cu-based film in the recess.

2. The Cu wiring manufacturing method of claim 1, wherein the annealing process leads to a reduction process of the $CuO_x$ film.

3. The Cu wiring manufacturing method of claim 2, wherein the reduction process during the annealing process is a $H_2$ radical process for processing a surface of the $CuO_x$ film by $H_2$ radicals.

4. The Cu wiring manufacturing method of claim 1, wherein the annealing process is performed at a temperature within a range from 100° C. to 400° C.

5. The Cu wiring manufacturing method of claim 1, wherein the $MnO_x$ film has a film thickness of 1 nm to 5 nm.

6. The Cu wiring manufacturing method of claim 1, wherein the $CuO_x$ film has a film thickness of 1 nm to 15 nm.

7. The Cu wiring manufacturing method of claim 1, wherein the $MnO_x$ film and the $CuO_x$ film are formed consecutively in a common processing chamber by ALD.

8. The Cu wiring manufacturing method of claim 7, wherein a $CuMnO_x$ film is formed as a mixing layer between the MnO film and the $CuO_x$ film.

9. The Cu wiring manufacturing method of claim 1, wherein the Cu-based film is formed by iPVD while setting a substrate temperature to 230° C. to 350° C.

10. The Cu wiring manufacturing method of claim 1, further comprising, after said forming the Cu-based film, forming an additional Cu layer by plating or PVD and removing the Cu-based film and the $MnO_x$ film on a surface other than the recess by polishing an entire top surface.

11. A Cu wiring manufacturing system for manufacturing a Cu wiring that fills a recess formed in a predetermined pattern on a surface of an interlayer insulating film of a substrate, the system comprising:
    a $MnO_x$ film forming apparatus configured to form a $MnO_x$ film that becomes a self-formed barrier film by reaction with the interlayer insulating film at least on a surface of the recess by ALD;
    a $CuO_x$ film forming apparatus configured to form a $CuO_x$ film that becomes a liner film on a surface of the $MnO_x$ film by CVD or ALD;
    an annealing apparatus configured to perform an annealing process on the substrate on which the $CuO_x$ film is formed and reduce the $CuO_x$ film to a Cu film by oxidation-reduction reaction between the $MnO_x$ film and the $CuO_x$ film; and
    a Cu-based film forming apparatus configured to form a Cu-based film on the Cu film obtained by reducing the $CuO_x$ film by PVD and fill the Cu-based film in the recess.

12. The Cu wiring manufacturing system of claim 11, wherein the annealing apparatus has a function of reducing the $CuO_x$ film.

13. The Cu wiring manufacturing system of claim 12, wherein the reduction function of the annealing apparatus is performed by processing a surface of the $CuO_x$ film by $H_2$ radicals.

14. The Cu wiring manufacturing system of claim 11, wherein the annealing apparatus is performed at a temperature within a range from 100° C. to 400° C.

15. The Cu wiring manufacturing system of claim 11, wherein the $MnO_x$ film forming apparatus and the $CuO_x$ film forming apparatus are configured as film forming apparatuses including a common processing chamber, and the $MnO_x$ film formation and the $CuO_x$ film formation are consecutively performed by ALD in a state where the substrate is mounted on a mounting table in the common processing chamber.

16. The Cu wiring manufacturing system of claim 15, wherein a $CuMnO_x$ film is formed between the $MnO_x$ film and the $CuO_x$ film in the common processing chamber.

17. The Cu wiring manufacturing system of claim 11, wherein the Cu-based film forming apparatus forms the Cu-based film by iPVD while setting a substrate temperature to 230° C. to 350° C.

18. The Cu wiring manufacturing system of claim 11, wherein the $MnO_x$ film formation of the $MnO_x$ film forming apparatus, the $CuO_x$ film formation of the $CuO_x$ film forming apparatus, the annealing process of the annealing apparatus, and the Cu-based film formation of the Cu-based film forming apparatus are performed without breaking a vacuum state.

19. The Cu wiring manufacturing system of claim 11, further comprising:

a Cu plating apparatus or a Cu-PVD apparatus configured to form an additional Cu layer after the Cu-based film formation.

20. The Cu wiring manufacturing system of claim 19, further comprising:

a polishing apparatus configured to remove the Cu-based film and the $MnO_x$ film on a surface other than the recess by polishing an entire top surface after the formation of the additional Cu layer.

21. A computer-executable storage medium storing a program for controlling a Cu wiring manufacturing system, wherein the program, when executed on a computer, controls the Cu wiring manufacturing system to perform the Cu wiring manufacturing method described in claim 1.

* * * * *